(12) United States Patent
Kim et al.

(10) Patent No.: US 12,185,614 B2
(45) Date of Patent: Dec. 31, 2024

(54) DISPLAY APPARATUS

(71) Applicant: Samsung Display Co., Ltd., Yongin-si (KR)

(72) Inventors: Changmok Kim, Yongin-si (KR); Kwanhee Lee, Yongin-si (KR); Jiwon Jung, Yongin-si (KR); Youngseo Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/930,010

(22) Filed: Jul. 15, 2020

(65) Prior Publication Data
US 2021/0175300 A1    Jun. 10, 2021

(30) Foreign Application Priority Data
Dec. 10, 2019    (KR) .......................... 10-2019-0163976

(51) Int. Cl.
*H10K 59/50*    (2023.01)
*G06F 3/044*    (2006.01)
(Continued)

(52) U.S. Cl.
CPC ........... *H10K 59/50* (2023.02); *G06F 3/0445* (2019.05); *G06F 3/0446* (2019.05);
(Continued)

(58) Field of Classification Search
CPC ............. H01L 51/5293; H01L 51/5253; H01L 51/5275; H01L 51/5271; H01L 51/5281; H01L 51/5268; H01L 27/323; H01L 27/3232; H01L 27/3216; H01L 2251/5369; G06F 3/0446; G06F 3/0445;
(Continued)

(56) References Cited

U.S. PATENT DOCUMENTS 8,963,138 B2    2/2015    Lim et al.
9,142,802 B2    9/2015    Miyamoto et al.
(Continued)

FOREIGN PATENT DOCUMENTS

CN    109390375 A    2/2019
CN    208622772 U    3/2019
(Continued)

OTHER PUBLICATIONS

Office Action issued by the CNIPA on Oct. 16, 2024, for Chinese Patent Application No. 202011409968.1, 9 pages.

*Primary Examiner* — Jimmy H Nguyen
(74) *Attorney, Agent, or Firm* — Lewis Roca Rothgerber Christie LLP

(57) ABSTRACT

A display apparatus includes a substrate, a pixel layer including a plurality of display devices on the substrate, an encapsulating member encapsulating the pixel layer, a light modulating layer on the encapsulating member, a functional layer on the light modulating layer, and a bonding layer located between the light modulating layer and the functional layer and to bond the light modulating layer and the functional layer, where the light modulating layer has openings corresponding to the plurality of display devices, and where the bonding layer fills the openings and has a refractive index that is greater than a refractive index of the light modulating layer.

16 Claims, 17 Drawing Sheets

(51) Int. Cl.
   *H10K 50/80* (2023.01)
   *H10K 50/844* (2023.01)
   *H10K 50/856* (2023.01)
   *H10K 59/40* (2023.01)

(52) U.S. Cl.
   CPC ......... *H10K 50/844* (2023.02); *H10K 50/856* (2023.02); *H10K 50/868* (2023.02); *H10K 59/40* (2023.02); *G06F 3/0443* (2019.05); *G06F 2203/04111* (2013.01)

(58) Field of Classification Search
   CPC ......... G06F 3/0443; G06F 2203/04111; H10K 59/40; H10K 59/50; H10K 50/856; H10K 50/844; H10K 50/868
   USPC .......................................... 345/76, 173, 174
   See application file for complete search history.

(56) References Cited

U.S. PATENT DOCUMENTS

| | | |
|---|---|---|
| 9,368,757 B2 | 6/2016 | Choi et al. |
| 9,806,262 B2 | 10/2017 | Kwon et al. |
| 10,011,742 B2 | 7/2018 | Keite-Telgenbüscher et al. |
| 10,050,236 B2 | 8/2018 | Chen et al. |
| 10,317,590 B2 | 6/2019 | Lee et al. |
| 10,388,913 B2 | 8/2019 | Jung et al. |
| 10,474,295 B2 | 11/2019 | Kim et al. |
| 10,553,651 B2 | 2/2020 | Yim et al. |
| 10,553,827 B2 | 2/2020 | Jang et al. |
| 10,971,702 B2 | 4/2021 | Kim et al. |
| 11,119,592 B2 | 9/2021 | Lee et al. |
| 2004/0217702 A1 | 11/2004 | Garner et al. |
| 2014/0042415 A1 | 2/2014 | Park et al. |
| 2017/0069808 A1* | 3/2017 | Kim .................... H01L 27/1248 |
| 2017/0133596 A1* | 5/2017 | Kwon ................. H01L 51/0024 |
| 2017/0261656 A1* | 9/2017 | Kim ......................... G02B 1/04 |
| 2019/0013495 A1 | 1/2019 | Kim et al. |
| 2019/0051711 A1 | 2/2019 | Lee et al. |
| 2019/0165061 A1 | 5/2019 | Jung et al. |
| 2019/0165074 A1* | 5/2019 | Lee ........................ H10K 50/86 |
| 2019/0214440 A1 | 7/2019 | Lee et al. |
| 2019/0218434 A1 | 7/2019 | Liu et al. |
| 2019/0221779 A1* | 7/2019 | Jang .................... H01L 27/3272 |
| 2019/0319076 A1 | 10/2019 | Lee et al. |

FOREIGN PATENT DOCUMENTS

| | | |
|---|---|---|
| CN | 110034164 A | 7/2019 |
| CN | 110120402 A | 8/2019 |
| DE | 102014207074 A1 | 10/2015 |
| EP | 3511808 A1 | 7/2019 |
| KR | 10-2014-0143916 A | 12/2014 |
| KR | 10-2016-0032793 A | 3/2016 |
| KR | 10-2017-0055074 A | 5/2017 |
| KR | 10-2017-0105699 A | 9/2017 |
| KR | 10-2018-0074880 A | 7/2018 |
| KR | 10-2019-0004863 A | 1/2019 |
| KR | 10-2019-0016635 A | 2/2019 |
| KR | 10-2019-0045908 A | 5/2019 |
| KR | 10-2019-0047668 A | 5/2019 |
| KR | 10-2019-0062678 A | 6/2019 |
| KR | 10-2019-0086605 A | 7/2019 |

* cited by examiner

DISPLAY APPARATUS

CROSS-REFERENCE TO RELATED APPLICATION

This application claims priority to and the benefit of Korean Patent Application No. 10-2019-0163976, filed on Dec. 10, 2019 in the Korean Intellectual Property Office (KIPO), the entire content of which is incorporated herein by reference.

BACKGROUND

1. Field

One or more embodiments relate to a display apparatus.

2. Description of Related Art

As demand for display apparatuses has grown, the need for display apparatuses capable of being used for various purposes has also increased. In line with this trend, display apparatuses have become larger and thinner, and demand for display apparatuses providing precise and vivid colors while having a large size and a small thickness has also increased.

SUMMARY

Aspects of one or more embodiments are directed toward a display apparatus having improved light extraction efficiency.

Additional aspects will be set forth in part in the description which follows and, in part, will be apparent from the description, or may be learned by practice of the presented embodiments of the disclosure.

According to one or more embodiments, a display apparatus includes: a substrate; a pixel layer including a plurality of display devices above the substrate; an encapsulating member encapsulating the pixel layer; a light modulating layer above the encapsulating member; a functional layer above the light modulating layer; and a bonding layer located between the light modulating layer and the functional layer to bond the light modulating layer and the functional layer, where the light modulating layer has openings corresponding to the plurality of display devices, and where the bonding layer fills the openings and has a refractive index that is greater than a refractive index of the light modulating layer.

The bonding layer may include a bonding film and a plurality of high refractive particles distributed in the bonding film, and where the refractive index of the bonding layer may be equal to or greater than about 1.6.

The bonding layer may include the plurality of high refractive particles by about 30 wt % to about 60 wt %, and where the refractive index of the bonding layer may be about 1.6 to about 1.8.

The bonding layer may further include scattered particles distributed in the bonding film, and where the scattered particles may be greater in average particle diameter than the plurality of high refractive particles.

An inner wall of each of the openings may include an inclined surface, and where a thickness of the light modulating layer may be about 1.5 μm to about 2.5 μm.

A lower end of the inner wall may have a concave shape.

The display apparatus may further include an input sensing layer between the encapsulating member and the light modulating layer and including a sensing electrode.

The sensing electrode may include grid lines forming a grid structure, and where the grid lines may be located to overlap the light modulating layer.

Each of the plurality of display devices may include a pixel electrode, an intermediate layer including an emission layer on the pixel electrode, and an opposite electrode on the intermediate layer, and where a portion of light emitted from the emission layer may be totally internally reflected from an interface of an inner wall of a corresponding opening from among the openings, and the bonding layer.

The functional layer may include a polarization layer.

According to one or more embodiments, a display apparatus includes a display device to emit light; a light modulating layer on the display device and having an opening corresponding to the display device, a bonding layer filling the opening and located above the light modulating layer, and a functional layer located above the bonding layer and bonded to the light modulating layer via the bonding layer, wherein the light modulating layer has a first refractive index, and the bonding layer has a second refractive index that is greater than the first refractive index, and where a portion of the light emitted from the display device may be totally internally reflected from an interface between an inner wall of the opening and the bonding layer.

The display device may include a pixel electrode, an intermediate layer including an emission layer arranged on the pixel electrode, and an opposite electrode on the intermediate layer, and the light modulating layer may be on the insulating layer covering an edge of the pixel electrode.

The display apparatus may further include an encapsulating member between the display device and the light modulating layer.

The display apparatus may further include an input sensing layer between the encapsulating member and the light modulating layer and including a sensing electrode.

The bonding layer may include a bonding film and a plurality of high refractive particles distributed in the bonding film.

The bonding layer may include the plurality of high refractive particles by about 30 wt % to about 60 wt %.

The second refractive index of the bonding layer may be about 1.6 to about 1.8.

The bonding layer may further include scattered particles distributed in the bonding film, and where the scattered particles may be greater in average particle diameter than the plurality of high refractive particles.

An inner wall of the opening may include an inclined surface, and a thickness of the light modulating layer is about 1.5 μm to about 2.5 μm.

A lower end of the inner wall may have a concave shape.

BRIEF DESCRIPTION OF THE DRAWINGS

The above and other aspects, features, and advantages of example embodiments of the disclosure will be more apparent from the following description taken in conjunction with the accompanying drawings, in which.

DETAILED DESCRIPTION

Figure 1:
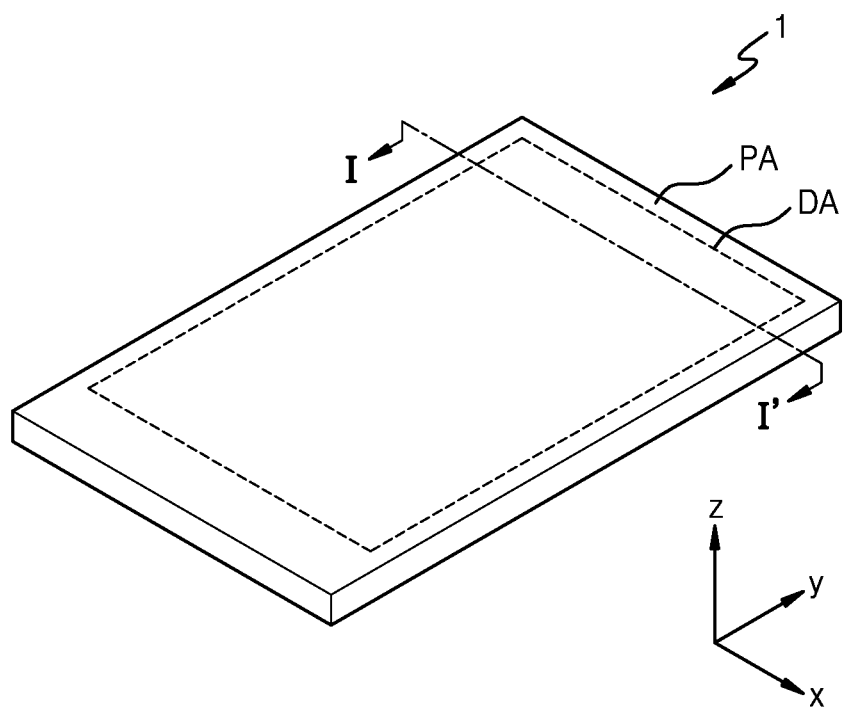
FIG. 1 is a schematic perspective view of a display apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

Further, the use of "may" when describing embodiments of the present disclosure refers to "one or more embodiments of the present disclosure".

As used herein, the phrases such as "a plan view" may refer to a view from top or from a direction normal to the display area of the display apparatus.

It will be further understood that the terms "includes," "including," "comprises," and/or "comprising" used herein specify the presence of stated features or components, but do not preclude the presence or addition of one or more other features or components.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It will be understood that when a layer, region, or component is referred to as being "formed on," another layer, region, or component, it can be directly or indirectly formed on the other layer, region, or component. That is, intervening layers, regions, or components may be present.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Sizes of elements in the drawings may be exaggerated for convenience of explanation. In other words, because sizes and thicknesses of components in the drawings are arbitrarily illustrated for convenience of explanation, the following embodiments are not limited thereto.

Hereinafter, embodiments of the disclosure are described in more detail with reference to the accompanying drawings, and elements that are the same or corresponding to each other are referred to by using the same reference numerals in the drawings.

Figure 2:
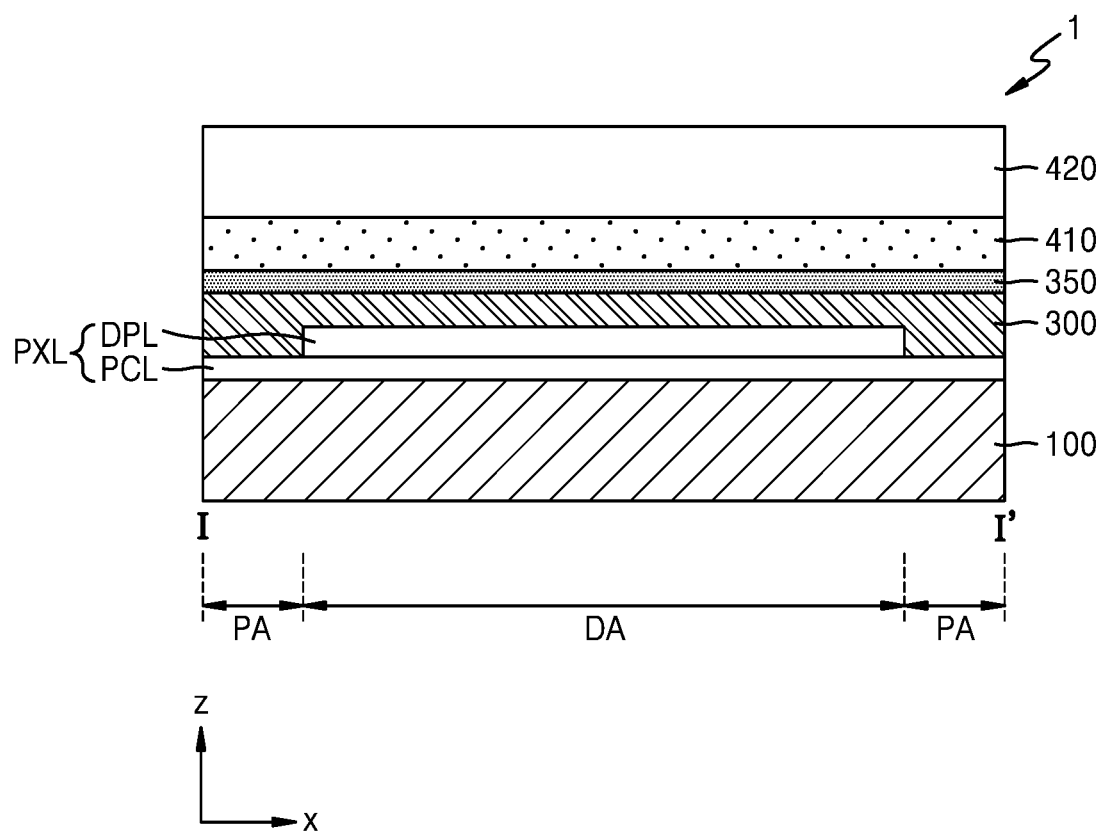
FIG. 2 is an example of a schematic cross-sectional view taken along the line I-I' of FIG. 1.

FIG. 1 is a schematic perspective view of a display apparatus 1 according to an embodiment, and FIG. 2 is a schematic cross-sectional view of an example of a portion taken along the line I-I' of FIG. 1.

Referring to FIG. 1, the display apparatus 1 according to one or more embodiments may include a display area DA and a peripheral area PA. The peripheral area PA may be arranged outside the display area DA to surround the display area DA. Various wiring and driving circuit portions for transmitting electrical signals to be applied to the display area DA, may be arranged in the peripheral area PA. The display apparatus 1 may provide a certain or set image by using light emitted from a plurality of pixels arranged in the display area DA. In one or more embodiments, the display apparatus 1 may be bent by including a bending area in an area of the peripheral area PA.

The display apparatus 1 may include a display, such as an organic light-emitting display, an inorganic light-emitting display (an inorganic electro luminance display), and/or a quantum dot light-emitting display. Hereinafter, descriptions are given with the organic light-emitting display as an example. The display apparatus 1 may be realized as various electronic devices, such as a mobile phone, a notebook computer, a smart watch, etc.

As illustrated in FIG. 2, the display apparatus 1 may include a substrate 100, a pixel layer PXL above the substrate 100, an encapsulating member 300 encapsulating the pixel layer PXL, a light modulating layer 350 on the encapsulating member 300, a bonding layer 410 on the light modulating layer 350, and a functional layer 420 on the bonding layer 410, which are sequentially stacked in a thickness direction (z-direction).

The substrate 100 may include a glass material and/or polymer resins. For example, the substrate 100 may include a glass material mainly including $SiO_2$, and/or various materials having flexible or bendable properties, such as resins and reinforced plastics. In one or more embodiments, the substrate 100 may be bent by including a bending area in an area of the peripheral area PA.

The pixel layer PXL may be arranged above the substrate 100. The pixel layer PXL may include a display device layer DPL including a display device arranged for each pixel and a pixel circuit layer PCL including a pixel circuit arranged for each pixel and insulating layers. The display device layer DPL may be arranged on an upper layer of the pixel circuit layer PCL, and a plurality of insulating layers may be arranged between the pixel circuit and the display device. Some wires and the insulating layers of the pixel circuit layer PCL may extend onto or into the peripheral area PA.

The encapsulating member 300 may include a thin-film encapsulating layer. The thin-film encapsulating layer may include at least one inorganic encapsulating layer and at least one organic encapsulating layer. When the display apparatus 1 includes the substrate 100 including polymer resins, and the encapsulating member 300 including the thin-film encapsulating layer including the inorganic encapsulating layer and the organic encapsulating layer, the display apparatus 1 may have improved flexibility.

The light modulating layer 350 may modulate a path of light emitted from the display device of the display device layer DPL and may improve light extraction efficiency of the display apparatus 1. As described below, the light modulating layer 350 may change an optical path of light emitted from a display device, together with the bonding layer 410, thereby increasing light extraction efficiency of the display apparatus 1.

The bonding layer 410 may bond the functional layer 420 over the encapsulating member 300 with a layer below the functional layer 420 (e.g., the light modulating layer 350). In one or more embodiments, the bonding layer 410 may have a higher refractive index than the light modulating layer 350, and thus, may improve the light extraction efficiency of the display apparatus 1.

The functional layer 420 may include a polarization layer. The polarization layer may transmit only light vibrating in the same direction as a polarization axis, of the light emitted from the display device of the display device layer DPL, and may absorb or reflect light vibrating in other directions (i.e., in a direction different from the direction of the polarization axis). In one or more embodiments, the functional layer 420 may further include an optical film for reducing reflection of external light, a window, etc.

Figure 3:
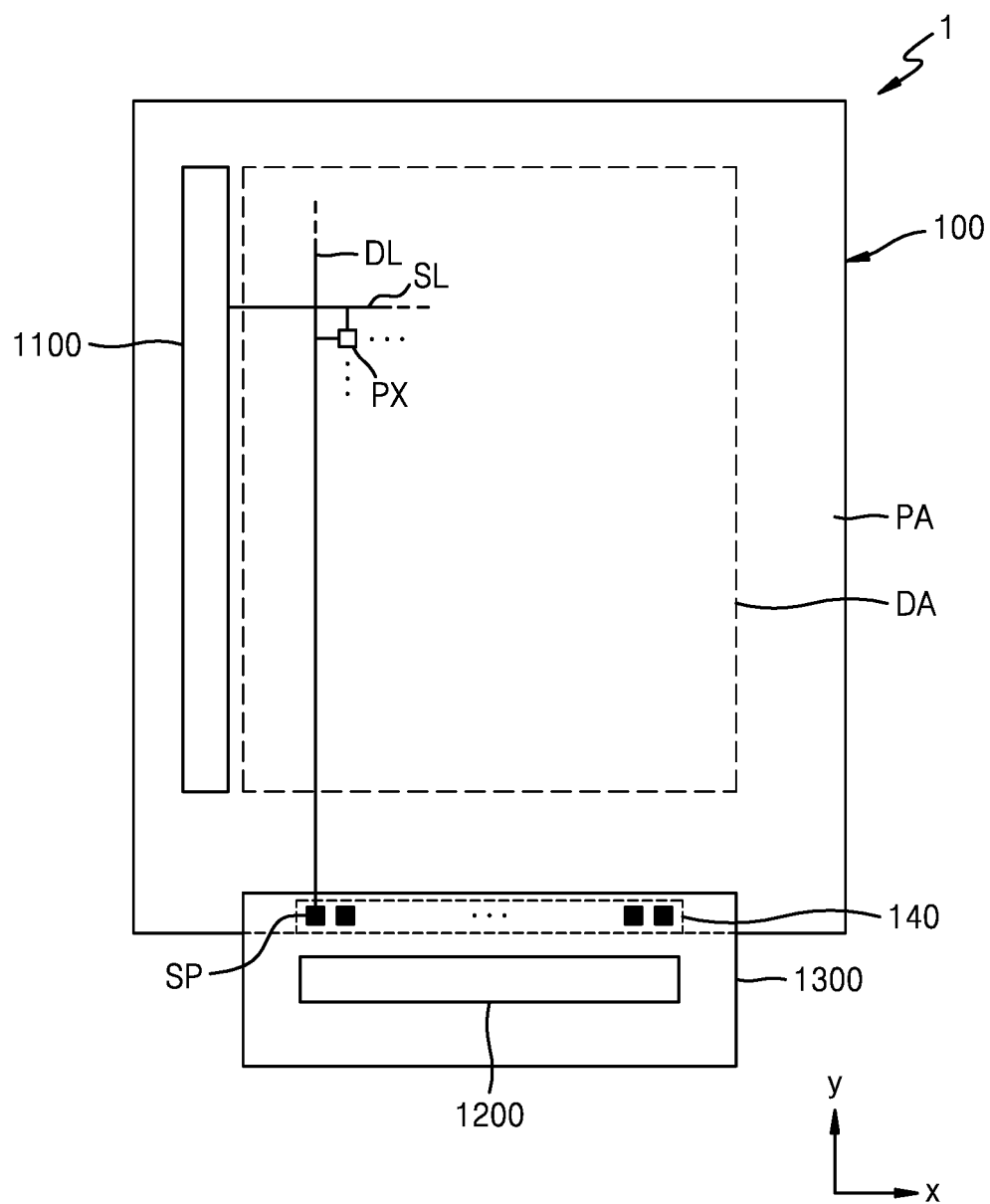
FIG. 3 is a schematic plan view of a portion of the display apparatus of FIG. 1.
Figure 4A:
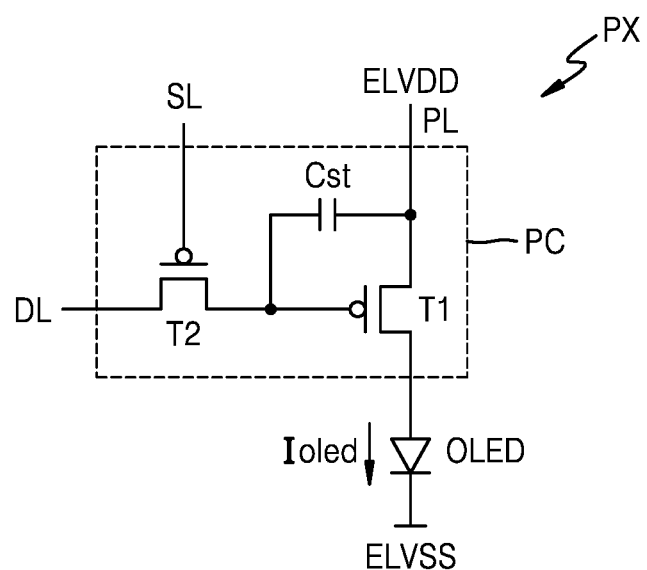
FIGS. 4A and 4B are circuit diagrams each illustrating an example of a pixel of the display apparatus of FIG. 1.
Figure 4B:
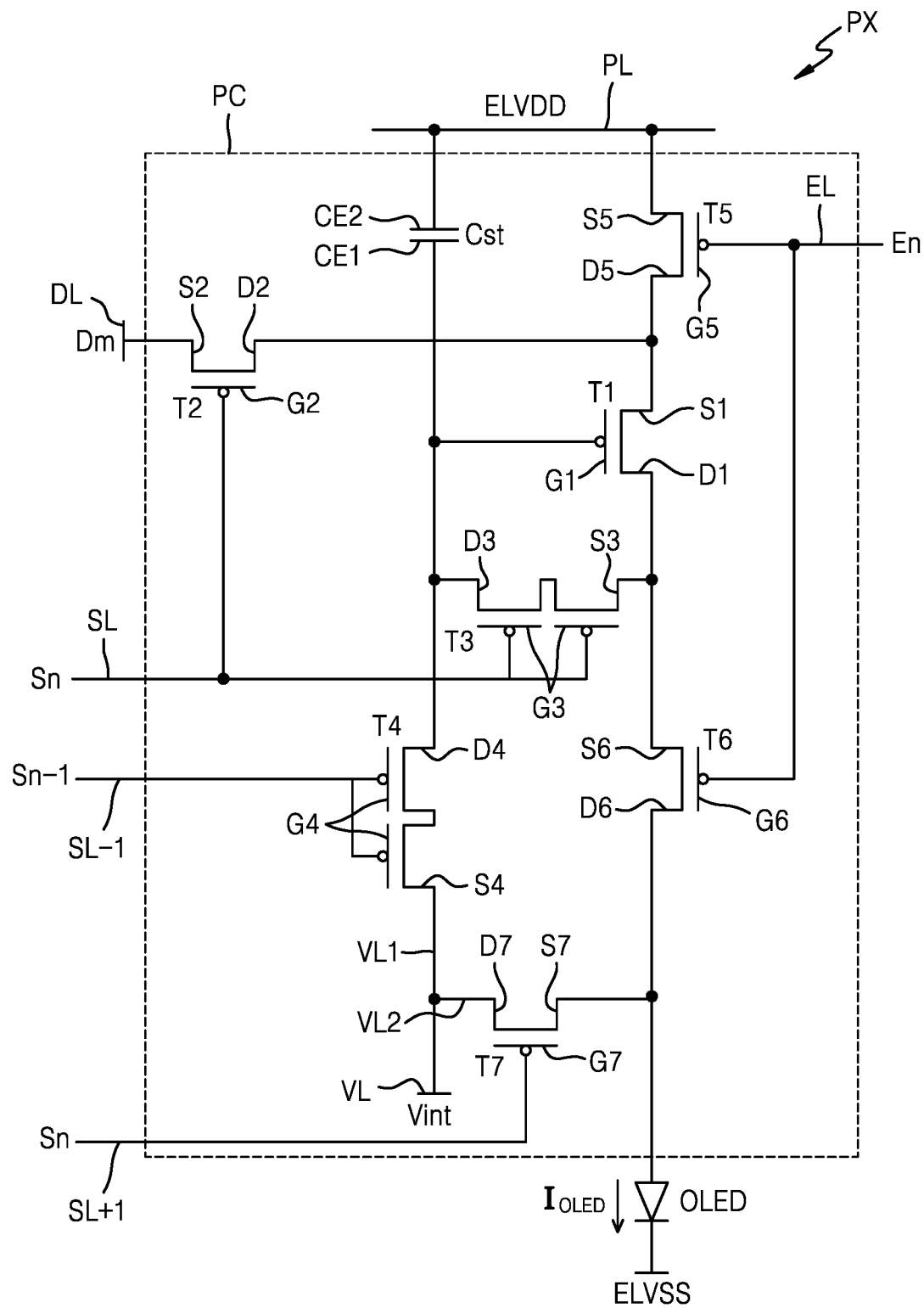

FIG. 3 is a schematic plan view of a portion of the display apparatus 1 of FIG. 1, and FIGS. 4A and 4B are circuit diagrams each illustrating an example of a pixel of the display apparatus 1 of FIG. 1.

Referring to FIG. 3, the substrate 100 may include the display area DA and the peripheral area PA. The peripheral area PA may be arranged outside the display area DA and may surround the display area DA.

A plurality of pixels PX arranged in a predetermined or set pattern in a first direction (x direction, a row direction) and a second direction (y direction, a column direction) may be provided in the display area DA above the substrate 100 (e.g., above the substrate in the thickness direction or the z-direction).

A scan driver 1100 providing a scan signal to each pixel PX, a data driver 1200 providing a data signal to each pixel PX, and main power wires providing a first voltage ELVDD (see FIGS. 4A and 4B) and a second voltage ELVSS (see FIGS. 4A and 4B) may be arranged in the peripheral area PA above the substrate 100. The first voltage ELVDD may be a driving voltage, and the second voltage ELVSS may be a common voltage. A pad portion 140 in which a plurality of signal pads SP connected to data lines DL are arranged with each other may be located in the peripheral area PA above the substrate 100 (e.g., above the substrate in the thickness direction or the z-direction).

The scan driver 1100 may include an oxide semiconductor thin-film transistor gate driver circuit (OSG) or an amorphous silicon thin-film transistor gate driver circuit (ASG). FIG. 3 illustrates an example in which the scan driver 1100 is arranged to be adjacent to a side of the substrate 100. However, according to one or more embodiments, the scan driver 1100 may be arranged to be adjacent to two opposite sides of the substrate 100 (e.g., arranged as two drivers respectively adjacent to the two sides that face oppositely away from each other in the x-direction).

FIG. 3 illustrates a chip on film (COF) method, in which a data driver 1200 is arranged on a film 1300 connected (e.g., electrically connected) to the signal pads SP arranged above the substrate 100 (e.g., above the substrate in the thickness direction or the z-direction). However, the disclosure is not limited thereto. According to another embodiment, the data driver 1200 may be arranged above (e.g., directly above) the substrate 100 by using a chip on glass (COG) method or a chip on plastic (COP) method. The data driver 1200 may be connected (e.g., electrically connected) to a flexible printed circuit board (FPCB).

Referring to FIG. 4A, the pixel PX may include a pixel circuit PC connected to the scan line SL, the data line DL, and the power line PL, and a display device (e.g., an organic light-emitting diode OLED) connected (e.g., electrically connected) to the pixel circuit PC. The pixel circuit PC may include a transistor (e.g., a first transistor T1 or a second transistor T2) and a capacitor (e.g., a capacitor Cst), and the display device may include an organic light-emitting diode OLED.

The pixel circuit PC may include a first transistor T1, a second transistor T2, and a capacitor Cst. Each pixel PX may emit light (e.g., red, green, blue, or white light) through the organic light-emitting diode OLED. The first transistor T1 and/or the second transistor T2 may be thin film transistors.

The second transistor T2 may be a switching transistor and may be connected to the scan line SL and the data line DL. In response to a scan signal that is input from the scan line SL, the second transistor T2 may transmit a data signal that is input from the data line DL to the first transistor T1 (e.g., the gate of the first transistor T1) and the capacitor Cst. The capacitor Cst may be connected to the second transistor T2 and a voltage line PL and may store a voltage corresponding to a difference between a voltage corresponding to the data signal that is transmitted from the second transistor according to a switching operation of the second transistor T2 and the first voltage ELVDD supplied to a voltage line PL. In other words, the capacitor Cst may include a first electrode connected to the second transistor T2 and a second electrode connected to the voltage line PL. The second electrode of the capacitor Cst may be connected to the first transistor T1.

The first transistor T1 may be a driving transistor and may be connected to the voltage line PL and the capacitor Cst. The first transistor T1 may control a driving current Ioled flowing from the voltage line PL to the organic light-emitting diode OLED in correspondence to the voltage stored in the capacitor Cst.

The organic light-emitting diode OLED may emit light having a predetermined or set brightness based on the driving current Ioled. The organic light-emitting diode OLED may include a pixel electrode, an opposite electrode, and an emission layer between the pixel electrode and the opposite electrode. The opposite electrode of the organic light-emitting diode OLED may receive the second voltage ELVSS.

In FIG. 4A, it is described that the pixel circuit PC includes two transistors (e.g., the first transistor T1 and the second transistor T2) and one capacitor (e.g., the capacitor Cst). However, the disclosure is not limited thereto. The number of transistors and the number of capacitors may vary according to a design of the pixel circuit PC.

As another example, referring to FIG. 4B, one pixel PX may include a pixel circuit portion PC connected to the signal lines SL, SL−1, SL+1, EL, and DL and a voltage line PL, and an organic light-emitting diode OLED connected (e.g., electrically connected) to the pixel circuit portion PC.

The pixel circuit portion PC may include a plurality of transistors T1 through T7 (a driving transistor T1, a switching transistor T2, a compensation transistor T3, a first initialization transistor T4, an operation control transistor T5, an emission control transistor T6, and a second initialization transistor T7) and a storage capacitor Cst, as illustrated in FIG. 4B. The transistors T1 through T7 and the storage capacitor Cst may be connected to signal lines SL, SL−1, SL+1, EL, and DL, a first initialization voltage line VL1, a second initialization voltage line VL2, and a voltage line PL.

The signal lines SL, SL−1, SL+1, EL, and DL may include a scan line SL transmitting (providing) a scan signal Sn, a previous scan line SL−1 transmitting a previous scan signal Sn−1 to a first initialization transistor T4 (e.g., a first initialization gate electrode G4 of the first initialization transistor T4), an after scan line SL+1 transmitting a scan signal Sn to a second initialization transistor T7 (e.g., a second initialization gate electrode G7 of the second initialization transistor T7), an emission control line EL transmitting an emission control signal En to an operation control transistor T5 (e.g., an operation control gate electrode G5 of the operation control transistor T5) and an emission control transistor T6 (e.g., an emission control gate electrode G6 of the emission control transistor T6), and a data line DL crossing the scan line SL and transmitting a data signal Dm. The voltage line PL may transmit a first voltage ELVDD to the driving transistor T1, a first initialization voltage line VL1 may transmit an initialization voltage Vint to the first initialization transistor T4, and a second initialization voltage line VL2 may transmit the initialization voltage Vint to the second initialization transistor T7.

A driving gate electrode G1 of the driving transistor T1 may be connected to a lower electrode CE1 of the storage capacitor Cst, a driving source electrode S1 of the driving transistor T1 may be connected to the voltage line PL through the operation control transistor T5, and a driving drain electrode D1 of the driving transistor T1 may be connected (e.g., electrically connected) to a pixel electrode of the main organic light-emitting diode OLED through the emission control transistor T6. The driving transistor T1 may receive the data signal Dm according to a switching operation of the switching transistor T2 and supply a driving current $I_{OLED}$ to the organic light emitting-diode OLED.

A switching gate electrode G2 of the switching transistor T2 may be connected to the scan line SL, a switching source electrode S2 of the switching transistor T2 may be connected to the data line DL, and a switching drain electrode D2 of the switching transistor T2 may be connected to the driving source electrode S1 of the driving transistor T1 and connected to the lower voltage line PL through the operation control transistor T5. The switching transistor T2 may be turned-on in response to the scan signal Sn transmitted through the scan line SL and may perform the switching operation of transmitting the data signal Dm transmitted through the data line DL to the driving source electrode S1 of the driving transistor T1.

A compensation gate electrode G3 of a compensation transistor T3 may be connected to the scan line SL, a compensation source electrode S3 of the compensation transistor T3 may be connected to the driving drain electrode D1 of the driving transistor T1 and connected to the pixel electrode of the organic light-emitting diode OLED through the emission control transistor T6, and a compensation drain electrode D3 of the compensation transistor T3 may be connected to the lower electrode CE1 of the storage capacitor Cst, a first initialization drain electrode D4 of the first initialization transistor T4, and the driving gate electrode G1 of the driving transistor T1. The compensation transistor T3 may be turned-on in response to the scan signal Sn transmitted through the scan line SL and may connect (e.g., electrically connect) the driving gate electrode G1 of the driving transistor T1 with the driving drain electrode D1 of the driving transistor T1, thereby diode-connecting the driving transistor T1.

A first initialization gate electrode G4 of the first initialization transistor T4 may be connected to the previous scan line SL−1, a first initialization source electrode S4 of the first initialization transistor T4 may be connected to the first initialization voltage line VL1, and the first initialization drain electrode D4 of the first initialization transistor T4 may be connected to the lower electrode CE1 of the storage capacitor Cst, the compensation drain electrode D3 of the compensation transistor T3, and the driving gate electrode G1 of the driving transistor T1. The first initialization transistor T4 may be turned-on in response to a previous scan signal Sn−1 transmitted through the previous scan line SL−1 and may perform an initialization operation of initializing a voltage of the driving gate electrode G1 of the driving transistor T1 by transmitting the initialization voltage Vint to the driving gate electrode G1 of the driving transistor T1.

An operation control gate electrode G5 of the operation control transistor T5 may be connected to the emission control line EL, an operation control source electrode S5 of the operation control transistor T5 may be connected to the lower voltage line PL, and an operation control drain electrode D5 of the operation control transistor T5 may be connected to the driving source electrode S1 of the driving transistor T1 and the switching drain electrode D2 of the switching transistor T2.

An emission control gate electrode G6 of the emission control transistor T6 may be connected to the emission control line EL, an emission control source electrode S6 of the emission control transistor T6 may be connected to the driving drain electrode D1 of the driving transistor T1 and the compensation source electrode S3 of the compensation transistor T3, and an emission control drain electrode D6 of the emission control transistor T6 may be connected (e.g., electrically connected) to a second initialization source electrode S7 of the second initialization transistor T7 and the pixel electrode of the organic light-emitting diode OLED.

The operation control transistor T5 and the emission control transistor T6 may be concurrently (e.g., simultaneously) turned-on in response to an emission control signal En transmitted through the emission control line EL to transmit a first voltage ELVDD to the main organic light-emitting diode OLED. Thus, driving currents IDLED may flow through the organic light-emitting diode OLED.

A second initialization gate electrode G7 of the second initialization transistor T7 may be connected to the after scan line SL+1, the second initialization source electrode S7 of the second initialization transistor T7 may be connected to the emission control drain electrode D6 of the emission control transistor T6 and the pixel electrode of the main organic light-emitting diode OLED, and a second initialization drain electrode D7 of the second initialization transistor T7 may be connected to the second initialization voltage line VL2.

The scan line SL and the after scan line SL+1 are connected (e.g., electrically connected) with each other, and thus, the same scan signal Sn may be applied to the scan line SL and the after scan line SL+1. Thus, the second initialization transistor T7 may be turned-on in response to the scan signal Sn transmitted through the after scan line SL+1 and may perform the operation of initializing the pixel electrode of the organic light-emitting diode OLED.

An upper electrode CE2 of the storage capacitor Cst may be connected to the voltage line PL and a common electrode of the organic light-emitting diode OLED may be connected to the second voltage ELVSS. Accordingly, the organic light-emitting diode OLED may receive the driving current IDLED from the driving transistor T1 and may emit light to display an image.

FIG. 4B illustrates that the compensation transistor T3 and the first initialization transistor T4 have dual gate electrodes. However, the compensation transistor T3 and the first initialization transistor T4 may have one gate electrode (i.e., a single gate electrode).

FIG. 4B describes the structure of one pixel circuit PC. However, a plurality of pixels PX having (e.g., each having) the same pixel circuit PC may be arranged to form a plurality of rows, and in this case, the first initialization voltage line VL1, the previous scan line SL−1, the second initialization voltage line VL2, and the after scan line SL+1 may be shared by neighboring pixels (e.g., adjacent pixels of the plurality of pixels).

For example, the first initialization voltage line VL1 and the previous scan line SL−1 may be connected (e.g., electrically connected) to a second initialization transistor of another pixel circuit PC arranged in the second direction (or the y direction). Thus, a previous scan signal applied to the previous scan line SL−1 may be transmitted to the second initialization transistor of the other pixel circuit PC as an after scan signal. Likewise, the second initialization voltage line VL2 and the after scan line SL+1 may be connected (e.g., electrically connected) to a first initialization transistor of yet another pixel circuit PC arranged to be adjacent in the second direction (or the y direction) based on the drawings (e.g., as illustrated in FIG. 3), so as to transmit the previous scan signal and the initialization voltage.

Figure 5:
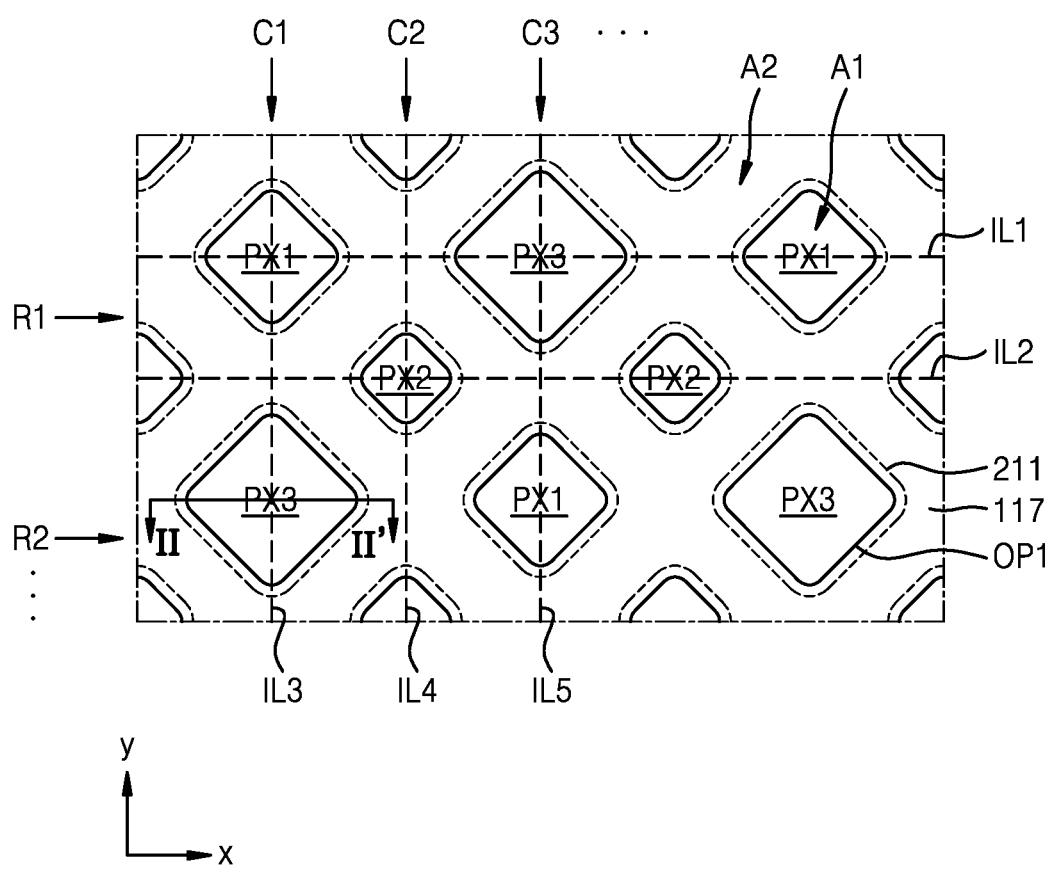
FIG. 5 is a partial plan view schematically illustrating an example of pixel arrangement of the display apparatus of FIG. 1.
Figure 6:
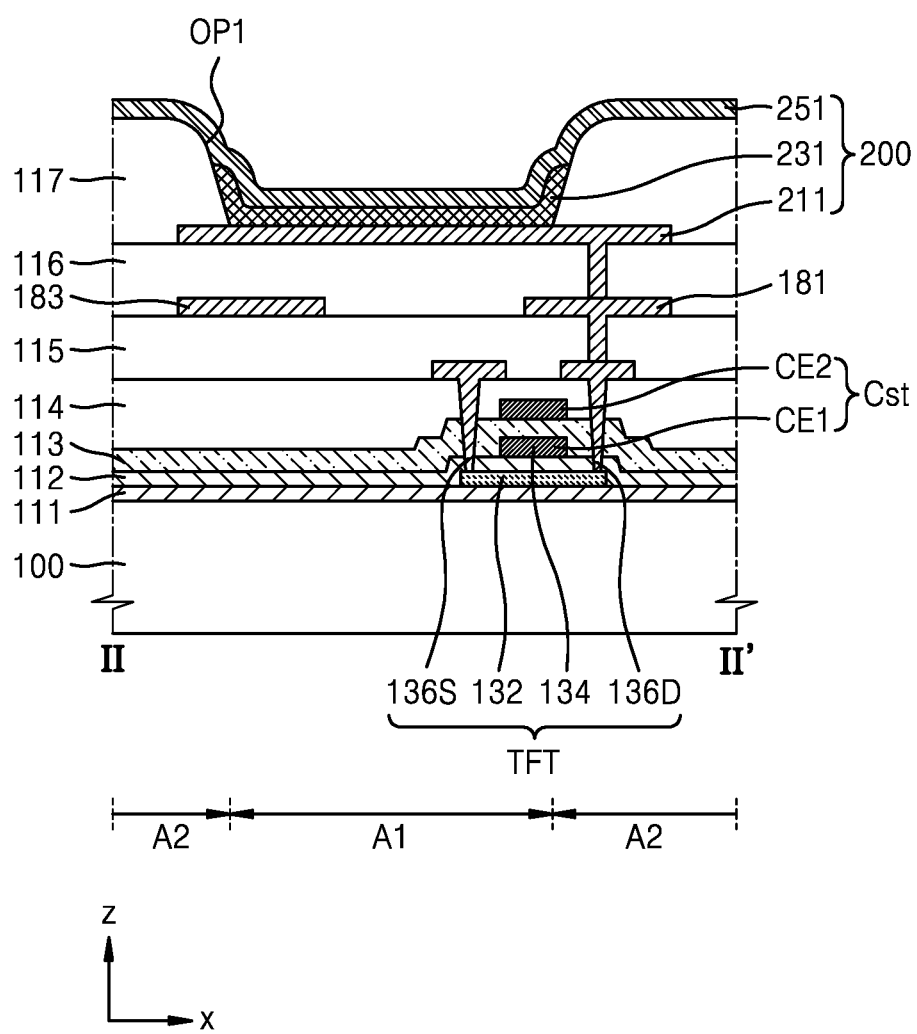
FIG. 6 is an example of a schematic cross-sectional view taken along the line II-II' of FIG. 5.

FIG. 5 is a schematic partial plan view of an example of pixel arrangement of the display apparatus 1 of FIG. 1, and FIG. 6 is a schematic cross-sectional view of an example of a portion taken along the line II-II' of FIG. 5.

A plurality of pixels may include a first pixel PX1, a second pixel PX2, and a third pixel PX3. The first pixel PX1, the second pixel PX2, and the third pixel PX3 may be repeatedly arranged in a predetermined or set pattern in a column direction and a row direction. In one or more embodiments, the first pixel PX1 and the third pixel PX3 may be alternately arranged or provided with each other in a column direction and a row direction, and the second pixel PX2 may be repeatedly arranged or provided in a column direction and a row direction. Each of the first pixel PX1, the second pixel PX2, and the third pixel PX3 may include a pixel circuit and an organic light-emitting diode OLED connected (e.g., electrically connected) to the pixel circuit. The organic light-emitting diode OLED of each pixel may be arranged above (e.g., directly above) the pixel circuit to overlap the pixel circuit (e.g., overlap the pixel circuit in the thickness direction or the z-direction) or may be offset with respect to the pixel circuit and arranged to overlap a pixel circuit (e.g., overlap the pixel circuit in the thickness direction or the z-direction) of a pixel in an adjacent row or column. The pixel arrangement may be the arrangement of the organic light-emitting diode OLED included in each of the first through third pixels PX1 through PX3 (the first pixel PX1, the second pixel PX2, and the third pixel PX3) or the arrangement of a pixel electrode 211 included in the organic light-emitting diode OLED.

In each row R1, R2, or the like, the pixel electrode 211 of the first pixel PX1, the pixel electrode 211 of the second pixel PX2, the pixel electrode 211 of the third pixel PX3, and the pixel electrode 211 of the second pixel PX2 may be alternately arranged in a zig-zag form to be spaced apart from one another. The pixel electrode 211 of the first pixel PX1 and the pixel electrode 211 of the third pixel PX3 may be arranged to be spaced apart from each other and may be alternately arranged on a first virtual straight line IL1 in a first direction (or an x direction). The pixel electrode 211 of the second pixel PX2 may be offset with respect to the pixel electrode 211 of the first pixel PX1 and the pixel electrode 211 of the third pixel PX3 in a direction between the first direction (or the x direction) and a second direction (or a y direction) and may be repeatedly arranged on a second virtual straight line IL2 in the first direction (or the x direction).

In a first column C1, the pixel electrode 211 of the first pixel PX1 and the pixel electrode 211 of the third pixel PX3 may be alternately arranged on a third virtual straight line IL3 in the second direction (or the y direction) to be spaced apart from each other. In a second column C2 adjacent to the first column Cl, the pixel electrode 211 of the second pixel PX2 may be repeatedly arranged on a fourth virtual straight line IL4 in the second direction (or the y direction) to be spaced apart from each other. In a third column C3 adjacent to the second column C2, the pixel electrode 211 of the third pixel PX3 and the pixel electrode 211 of the first pixel PX1 may be arranged to be spaced apart from each other and may be alternately arranged on a fifth virtual straight line IL5 in the second direction (or the y direction). In one or more embodiments, the pixel electrode 211 of the third pixel PX3 and the pixel electrode 211 of the first pixel PX1 in the third column C3 may be arranged opposite to the pixel electrode 211 of the first pixel PX1 and the pixel electrode 211 of the third pixel PX3 in the first column C1. In one or more embodiments, the pixel electrode 211 of the third pixel PX3 in the third column C3 is aligned with the pixel electrode 211 of the first pixel PX1 in the first column C1 along the first virtual line IL1, and the pixel electrode 211 of the first pixel PX1 in the third column C3 is aligned with the pixel electrode 211 of third pixel PX3 in the first column C1 along the second virtual line IL2.

The pixel electrode 211 of the first pixel PX1, the pixel electrode 211 of the second pixel PX2, and the pixel electrode 211 of the third pixel PX3 may have different areas (e.g., areas of different size). According to one or more embodiments, the pixel electrode 211 of the third pixel PX3 may have a larger or greater area than the pixel electrode 211 of the first pixel PX1 adjacent to the third pixel PX3. In one or more embodiments, the pixel electrode 211 of the third pixel PX3 may have a larger or greater area than the pixel electrode 211 of the second pixel PX2 adjacent to the third pixel PX3. The pixel electrode 211 of the first pixel PX1 may have a larger or greater area than the pixel electrode 211 of the second pixel PX2 adjacent to the first pixel PX1. However, the disclosure is not limited thereto. According to another embodiment, the pixel electrode 211 of the third pixel PX3 may have the same or substantially the same area as the pixel electrode 211 of the first pixel PX1. The pixel electrode 211 may have a polygonal shape (e.g., a square shape, an octagonal shape, etc.), a circular shape, an oval shape, etc., and a polygon may include a shape having a round vertex, corner, or edge.

According to one or more embodiments, the first pixel PX1 may include a red pixel emitting red light, the second pixel PX2 may include a blue pixel emitting blue light, and the third pixel PX3 may include a green pixel emitting green light. However, the disclosure is not limited thereto. According to another embodiment, the first pixel PX1 may include a red pixel, the second pixel PX2 may include a green pixel, and the third pixel PX3 may include a blue pixel.

The display area DA of the substrate 100 may include a first area A1 and a second area A2 adjacent to the first area A1. The first area A1 may be an area in which the organic light-emitting diode OLED of each of the first pixel PX1, the second pixel PX2, and the third pixel PX3 is located. The pixel electrode 211 may be arranged in the first area A1, and an area of the first area A1 may be less than an area of the pixel electrode 211. Each of the first pixel PX1, the second pixel PX2, and the third pixel PX3 may be located in a separate first area A1 of a plurality of first areas A1. The second area A2 may surround the first area A1 and may be an area located between a plurality of first areas A1. The third insulating layer 117 may be arranged in the second area A2. The first area A1 may correspond to an area of the pixel electrode 211, the area being exposed through a first opening OP1 of the third insulating layer 117, and the second area A2 may correspond to an area, in which the third insulating layer 117 is arranged, between the pixel electrodes 211. Thus, the first area A1 and the second area A2 of the substrate 100 may be understood as the first area A1 and the second area A2 of the pixel PX. As used herein, the first area A1 is defined as an area corresponding to a lower surface of the first opening OP1, the lower surface having a minimum area when viewed from a plan view as illustrated in FIG. 5. FIG. 5 illustrates an outline of the lower surface of the first opening OP1 as solid lines and an outline of the pixel electrode 211 as dashed lines.

Referring to FIG. 6, a buffer layer 111 may be arranged above the substrate 100 to prevent or substantially prevent penetration of impurities into a semiconductor layer of a thin-film transistor.

The substrate 100 may include various materials, such as a glass material, a metal material, and/or a plastic material. According to one or more embodiments, the substrate 100 may include a flexible substrate. For example, the substrate 100 may include polymer resins, such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), and/or cellulose acetate propionate (CAP).

The buffer layer 111 may include an inorganic insulating material, such as silicon nitride or silicon oxide and may include a single layer or multiple layers.

A thin-film transistor TFT, a capacitor Cst, and an organic light-emitting diode 200 connected (e.g., electrically connected) to the thin-film transistor TFT may be arranged above the substrate 100. That the organic light-emitting diode 200 is connected (e.g., electrically connected) to the thin-film transistor TFT may be understood as that the thin-film transistor TFT is connected (e.g., electrically connected) to the pixel electrode 211. The thin-film transistor TFT may include the first transistor T1 of FIGS. 4A and 4B.

The thin-film transistor TFT may include a semiconductor layer 132, a gate electrode 134, a source electrode 136S, and a drain electrode 136D. The semiconductor layer 132 may include an oxide semiconductor material. The semiconductor layer 132 may include amorphous silicon, polycrystalline silicon, and/or an organic semiconductor material. The gate electrode 134 may be formed as a single layer or multiple layers by including at least one of, for example, Al, Pt, Pd, Ag, Mg, Au, Ni, Nd, Ir, Cr, Li, Ca, Mo, Ti, W, and/or Cu based on adhesion with an adjacent layer, surface smoothness of a layer on which the gate electrode 134 is stacked, processability, etc.

A gate insulating layer 112 including an inorganic material, such as silicon oxide, silicon nitride, and/or silicon oxynitride, may be arranged between the semiconductor layer 132 and the gate electrode 134. A first interlayer insulating layer 113 and a second interlayer insulating layer 114 including an inorganic material, such as silicon oxide, silicon nitride, and/or silicon oxynitride, may be arranged between the gate electrode 134, the source electrode 136S, and the drain electrode 136D. Each of the source electrode 136S and the drain electrode 136D may be connected (e.g., electrically connected) to the semiconductor layer 132 through a contact hole formed in the gate insulating layer 112, the first interlayer insulating layer 113, and the second interlayer insulating layer 114.

The source electrode 136S and the drain electrode 136D may include a single layer or multiple layers including at least one of Al, Pt, Pd, Ag, Mg, Au, Ni, Nd, Ir, Cr, Li, Ca, Mo, Ti, W, and/or Cu.

The capacitor Cst may include the lower electrode CE1 and the upper electrode CE2 overlapping each other with the first interlayer insulating layer 113 therebetween. The capacitor Cst may overlap the thin-film transistor TFT. However, the disclosure is not limited thereto. According to another embodiment, the capacitor Cst may not overlap the thin-film transistor TFT. FIG. 6 illustrates that the gate electrode 134 of the thin-film transistor TFT is the lower electrode CE1 of the capacitor Cst. The capacitor Cst may be covered by the second interlayer insulating layer 114.

A pixel circuit including the thin-film transistor TFT and the capacitor Cst may be covered by the first insulating layer 115 and the second insulating layer 116. The first insulating layer 115 and the second insulating layer 116 may be planarized organic insulating layers. The first insulating layer 115 and the second insulating layer 116 may include an organic insulating material, such as a general-purpose polymer, such as polymethylmethacrylate (PMMA) or polystyrene (PS), polymer derivatives having a phenol-based group, acryl-based polymers, imide-based polymers, arylether-based polymers, amide-based polymers, fluorine-based polymers, p-xylene-based polymers, vinyl alcohol-based polymers, and/or a blend thereof. According to one or more embodiments, the first insulating layer 115 and the second insulating layer 116 may include PI.

A display device (e.g., the organic light-emitting diode 200) may be arranged above the second insulating layer 116. The organic light-emitting diode 200 may include the pixel electrode 211, an intermediate layer 231, and an opposite electrode 251.

The pixel electrode 211 may be arranged on the second insulating layer 116 and may be connected to the thin-film transistor TFT through a connection electrode 181 on the first insulating layer 115. Wires 183, such as a data line DL, a power line PL, etc., may be arranged on the first insulating layer 115.

The pixel electrode 211 may include conductive oxide, such as indium tin oxide (ITO), indium zinc oxide (IZO), zinc oxide (ZnO), indium oxide ($In_2O_3$), indium gallium oxide (IGO), and/or aluminum zinc oxide (AZO). According to another embodiment, the pixel electrode 211 may include a reflective layer including Ag, Mg, Al, Pt, Pd, Au, Ni, Nd, Ir, Cr, and/or a compound thereof. According to another embodiment, the pixel electrode 211 may further include a layer including ITO, IZO, ZnO, and/or $In_2O_3$, above/below the reflective layer described above.

A third insulating layer 117 may be arranged on the second insulating layer 116. The third insulating layer 117 may be a pixel-defining layer for defining a pixel by covering an edge of the pixel electrode 211 and having the first opening OP1 to expose a portion of the pixel electrode 211. The first opening OP1 may correspond to the first area A1. The third insulating layer 117 may increase a distance between the edge of the pixel electrode 211 and the opposite electrode 251, thereby preventing or substantially preventing an arc (electrical spark), etc., from occurring at the edge of the pixel electrode 211. In other words, a portion of the third insulating layer 117 may be between the edge of the pixel electrode 211 and the opposite electrode 251 in the thickness direction (or z direction). The third insulating layer 117 may include an organic material, such as PI or hexamethyldisiloxane (HMDSO).

The intermediate layer 231 may include an emission layer. The emission layer may include a high molecular-weight or a small molecular-weight organic material emitting light of a predetermined or set color. According to one or more embodiments, the intermediate layer 231 may include a first functional layer arranged below the emission layer and/or a second functional layer arranged above the emission layer. The first functional layer and/or the second functional layer may include a layer that is integral throughout the plurality of pixel electrodes 211 or may include a layer patterned to correspond to each of the plurality of pixel electrodes 211.

The first functional layer may include a single layer or multiple layers. For example, when the first functional layer includes a high molecular-weight material, the first functional layer may include a hole transport layer (HTL) having a single-layer structure, and may include poly-(3,4)-ethylene-dihydroxy thiophene (PEDOT) or polyaniline (PANI). When the first functional layer includes a small molecular-weight material, the first functional layer may include a hole injection layer (HII) and an HTL.

The second functional layer may not be always provided. For example, when the first functional layer and the emission layer include a high molecular-weight material, it is desirable that the second functional layer be formed so that the organic light-emitting diode has excellent characteristics. The second functional layer may include a single layer or multiple layers. The second functional layer may include an electron transport layer (ETL) and/or an electron injection layer (EIL).

The opposite electrode 251 may be arranged to face the pixel electrode 211 with the intermediate layer 231 therebetween. The opposite electrode 251 may include a conductive material having a low work function. For example, the opposite electrode 251 may include a (half) transparent layer including Ag, Mg, Al, Pt, Pd, Au, Ni, Nd, Ir, Cr, Li, Ca, or an alloy thereof. Alternatively, the opposite electrode 251 may further include a layer, such as ITO, IZO, ZnO, or $In_2O_3$, above the (half) transparent layer including the materials described above.

The opposite electrode 251 may be arranged above the intermediate layer 231 and the third insulating layer 117. The opposite electrode 251 may be integrally formed throughout the plurality of organic light-emitting diodes 200 in the display area DA to face the plurality of pixel electrodes 211.

Figure 7:
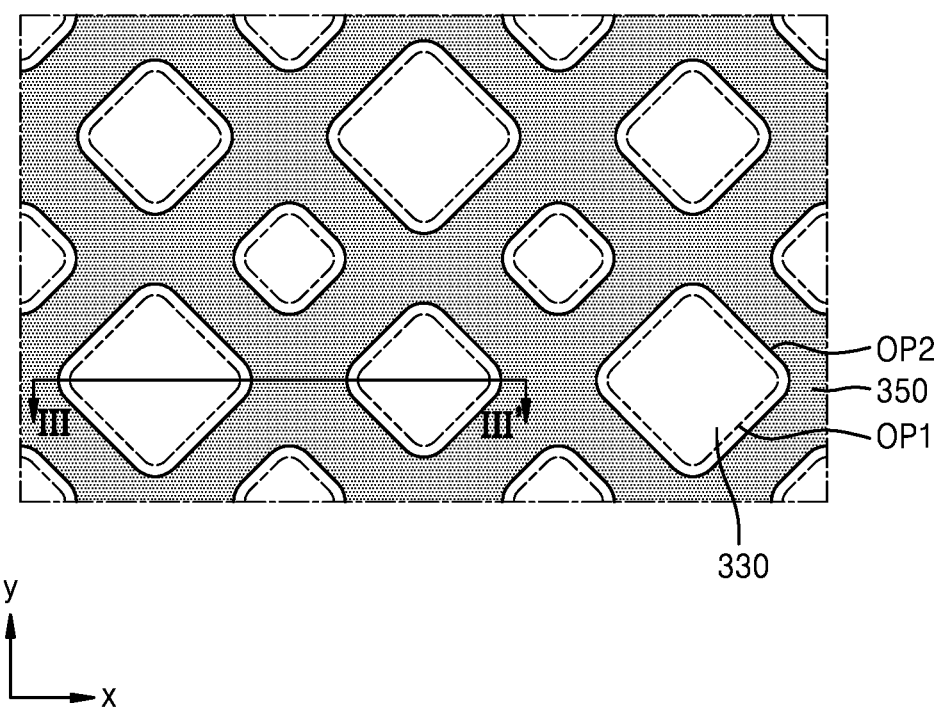
FIG. 7 is a partial plan view schematically illustrating an example of a light modulating layer of the display apparatus of FIG. 1.
Figure 8:
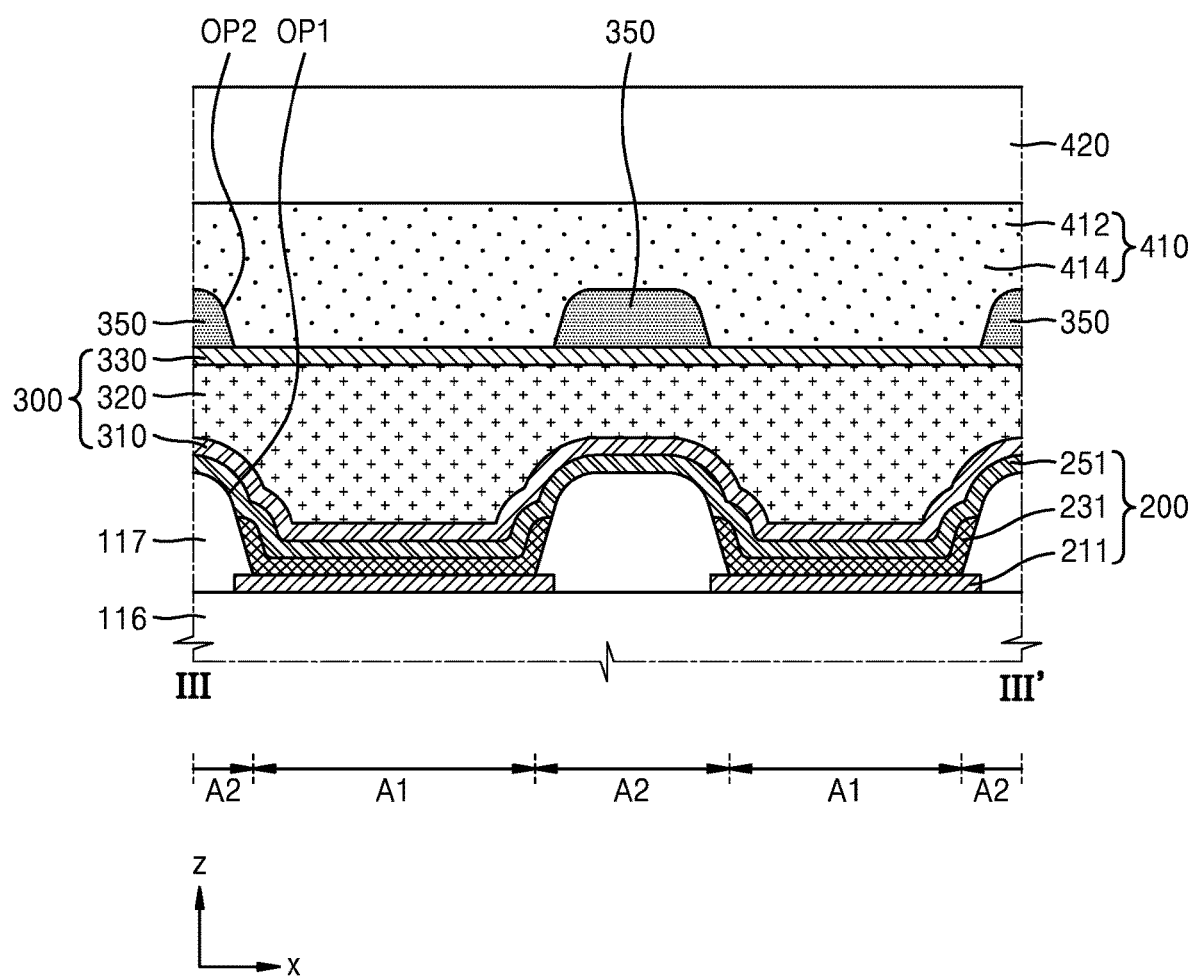
FIG. 8 is an example of a schematic cross-sectional view taken along the line III-III' of FIG. 7.
Figure 9:
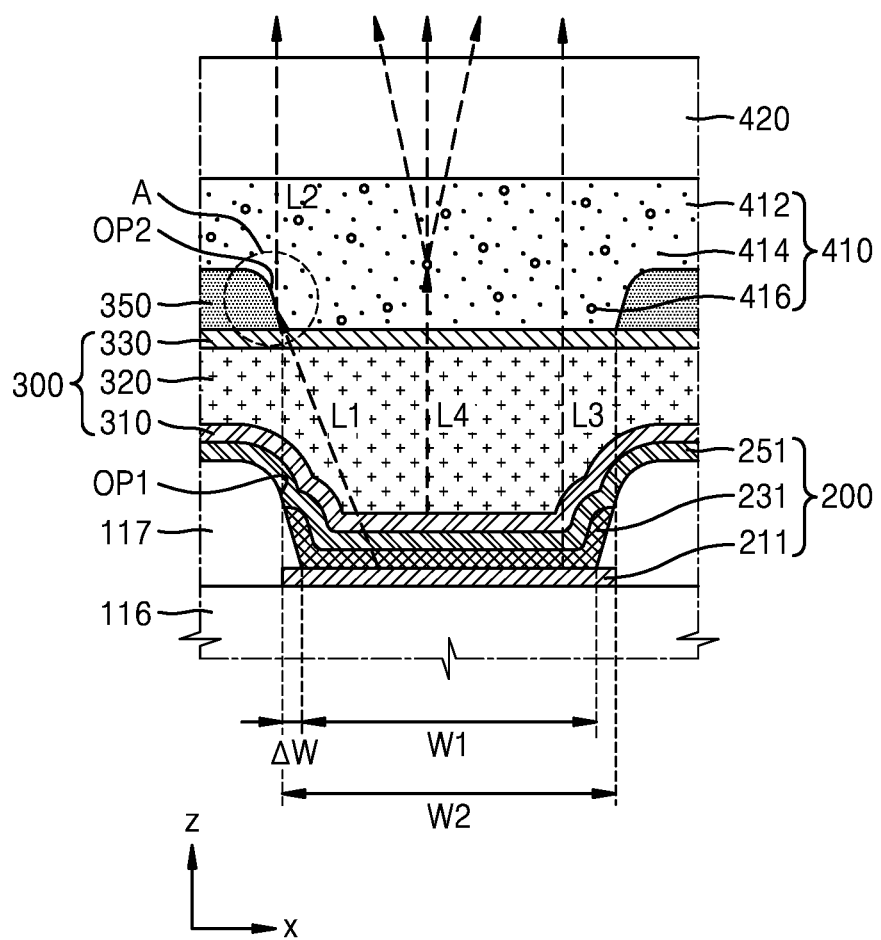
FIG. 9 is a schematic cross-sectional view of a portion of FIG. 8.
Figure 10:
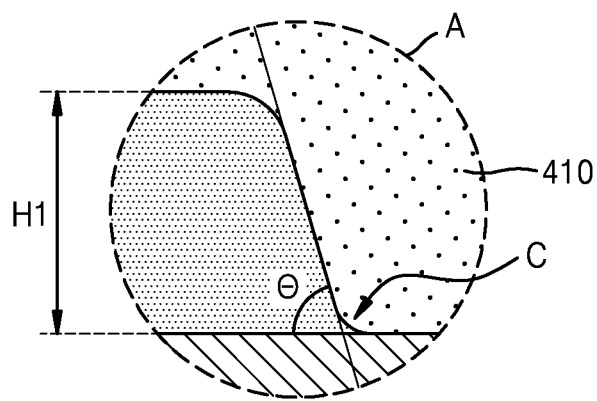
FIG. 10 is an enlarged schematic view of area A of FIG. 9.

FIG. 7 is a schematic partial plan view of an example of the light modulating layer 350 of the display apparatus 1 of FIG. 1, FIG. 8 is a schematic cross-sectional view of an example of a portion taken along the line III-III' of FIG. 7, FIG. 9 is a schematic cross-sectional view of a portion of FIG. 8, and FIG. 10 is a schematic enlarged view of area A of FIG. 9.

First, referring to FIGS. 7 and 8, a thin-film encapsulating layer may be arranged above the opposite electrode 251, as the encapsulating member 300. The thin-film encapsulating layer may protect or substantially protect the organic light-emitting diode 200 from external moisture or oxygen. The thin-film encapsulating layer may have a multi-layer structure. The thin-film encapsulating layer may include a first inorganic layer 310, an organic layer 320, and a second inorganic layer 330. When the thin-film encapsulating layer includes a multi-layer structure, cracks that occur in the thin-film encapsulating layer may not connect between the first inorganic layer 310 and the organic layer 320 and/or between the organic layer 320 and the second inorganic layer 330. Accordingly, a path through which external moisture or oxygen penetrates into the display area DA may be prevented, substantially prevented, or minimized. According to another embodiment, the number of organic layers and the number of inorganic layers may be any suitable number, and an order in which the organic layers and the inorganic layers are stacked may be different.

The first inorganic layer 310 may cover the opposite electrode 251 and may include at least one inorganic insulating material from among aluminum oxide, titanium oxide, tantalum oxide, hafnium oxide, zinc oxide, silicon oxide, silicon nitride, and/or silicon oxynitride. The first inorganic layer 310 may be formed on across or along a structure (e.g., the opposite electrode 251) therebelow, and thus, an upper surface of the first inorganic layer 310 may not be flat.

The organic layer 320 may cover the first inorganic layer 310 and may have a sufficient thickness (e.g., a sufficient thickness to cover the first inorganic layer 310). An upper surface of the organic layer 320 may be substantially flat throughout the display area DA. The organic layer 320 may include PET, PEN, PC, PI, polyethylene sulfonate, polyoxymethylene, polyarylate, HMDSO, acryl-based resins (e.g., polymethylmethacrylate, polyacryl acid, etc.), or a certain combination thereof.

The second inorganic layer 330 may cover the organic layer 320 and may include at least one inorganic insulating material from among aluminum oxide, titanium oxide, tantalum oxide, hafnium oxide, zinc oxide, silicon oxide, silicon nitride, and/or silicon oxynitride. The second inorganic layer 330 may extend to the outside of the organic layer 320 to contact the first inorganic layer 310 in the peripheral area PA so that the organic layer 320 may not be exposed to the outside.

In a process of forming the thin-film encapsulating layer, structures below the thin-film encapsulating layer may be damaged. For example, when forming the first inorganic layer 310, a layer directly below the first inorganic layer 310 may be damaged. Thus, in order to prevent or substantially prevent the structure below the thin-film encapsulating layer from being damaged in the process of forming the thin-film encapsulating layer, at least one capping layer and/or at least one protection layer may be arranged between the opposite electrode 251 and the thin-film encapsulating layer. The protection layer may include an inorganic material.

The light modulating layer 350, and the functional layer 420 such as a polarization layer, etc., may be arranged above the organic light-emitting diode 200 (e.g., above the encapsulating member 300). The functional layer 420 and the light modulating layer 350 may be bonded to each other via the bonding layer 410.

The light modulating layer 350 may modulate a path of light that is emitted from the emission layer of the organic light-emitting diode 200. The light modulating layer 350 may change a path of light progressing in side directions (e.g., directions except for a third direction (or z direction)), from the light that is emitted from the emission layer of the organic light-emitting diode 200, and allow the light to progress in the third direction (or z direction) that is approximately forward (e.g., perpendicular or normal to the display area of the display apparatus).

The light modulating layer 350 may be arranged to correspond to the second area A2 of the substrate 100 and may include a second opening OP2 exposing an uppermost surface of the encapsulating member 300 corresponding to the first area A1 of the substrate 100. That is, the light modulating layer 350 may be formed to have a grid structure by including a plurality of second openings OP2, as illustrated in FIG. 7. In FIG. 7, an outline of a lower surface of the second opening OP2 is illustrated as solid lines, and an outline of a lower surface of the first opening OP is illustrated as dashed lines.

The second opening OP2 of the light modulating layer 350 may surround the first opening OP1 of the third insulating layer 117 and may overlap the first opening OP1 of the third insulating layer 117. The second opening OP2 of the light modulating layer 350 may be greater in size than the first opening OP1 of the third insulating layer 117. In FIG. 7, a shape of the second opening OP2 is a square. However, the disclosure is not limited thereto. According to another embodiment, the second opening OP2 may have a circular shape, an oval shape, or a polygonal shape, such as triangular shape, or the like. A polygon may include a round or curved edge.

The light modulating layer 350 may have a first refractive index (e.g., a refractive index of about 1.4 to about 1.5). The light modulating layer 350 may include an inorganic material or an organic material having a low refractive index. For example, the inorganic material may include silicon oxide and/or fluoro magnesium, etc. The organic material may include at least one selected from the group consisting of acrylic, PI, polyamide, and tris (8-hydroxyquinolinato) aluminum (Alq3).

The bonding layer 410 may be located between the light modulating layer 350 and the functional layer 420 to bond the light modulating layer 350 and the functional layer 420 and may fill the second opening OP2 of the light modulating layer 350. In one or more embodiments, the bonding layer 410 may be formed as a film at a lower surface of the functional layer 420 prior to being bonded to the light modulating layer 350 by laminating the substrate 100 on which the light modulating layer 350 is formed with the functional layer 420.

The bonding layer 410 may include a bonding film 412 and high refractive particles 414 distributed in the bonding film 412. The bonding film 412 may include resins, such as acryl, PI, PC, etc., having light transmittance. The high refractive particles 414 may include inorganic particles and/or organic particles. For example, the inorganic particles may include at least one of $TiO_2$, $Al_2O_3$, $SiO_2$, $Al_2TiO_5$ and/or $ZrO_2$. The organic particles may include at least one of PMMA, PBMA, MS, PS and/or LPS. An average size of the high refractive particles 414 may be equal to or less than dozens of nm (e.g., equal to or less than 50 nm).

The bonding layer 410 may include the high refractive particles 414, and thus, may have a second refractive index that is greater than the first refractive index of the light modulating layer 350. The second refractive index of the bonding layer 410 may be equal to or greater than about 1.6. For example, the second refractive index of the bonding layer 410 may be about 1.6 to about 1.8. According to one or more embodiments, the light modulating layer 350 and the bonding layer 410 may have a refractive index difference of about 0.1 to about 0.3. As described above, because the bonding layer 410 filling the second opening OP2 of the light modulating layer 350 has a greater refractive index than the light modulating layer 350, total internal reflection occurs in an interface between the light modulating layer 350 and the bonding layer 410, and thus, light extraction efficiency of the display apparatus 1 (e.g., display apparatus illustrated in FIG. 1) may be improved.

When a content of the high refractive particles 414 is less than 30 wt %, an increase of the refractive index of the bonding layer 410 may not be large enough, and thus, it is difficult to increase the light extraction efficiency of the display apparatus 1 (e.g., display apparatus illustrated in FIG. 1). In contrast, when the content of the high refractive particles 414 is greater than 60 wt %, adhesion of the bonding layer 410 may be decreased and a modulus of the bonding layer 410 may be increased. In particular, when the modulus of the bonding layer 410 is increased, a rigidity property of the bonding layer 410, which is formed below the functional layer 420 in the form of a film, is increased, and thus, when the light modulating layer 350 and the bonding layer 410 are bonded to each other via lamination, pores may be generated between a side lower end C (e.g., side lower end C illustrated in FIG. 10) of the light modulating layer 350 and the bonding layer 410. Thus, the bonding layer 410 may include the high refractive particles 414 of about 30 wt % to about 60 wt %.

Hereinafter, referring to FIG. 9, a principle in which the efficiency of light extraction of the display apparatus 1 (e.g., display apparatus illustrated in FIG. 1) is improved via the light modulating layer 350 and the bonding layer 410 is described with reference to FIG. 9.

Referring to FIG. 9, the organic light-emitting diode 200 may be arranged above an insulating surface. The insulating surface may be an upper surface of at least one insulating layer above the substrate 100. For example, the insulating surface may be an upper surface of the second insulating layer 116.

A second width W2 of a lower surface of the second opening OP2 may be greater than a first width W1 of a lower surface of the first opening OP1. Here, the width may be a maximum width of the lower surface. A difference ΔW between the second width W2 and the first width W1 may be different for each pixel. For example, in the third pixel PX3 (e.g., the third pixel PX3 as illustrated in FIG. 5), the difference ΔW between the second width W2 and the first width W1 may be greater than a difference ΔW between the second width W2 and the first width W1 in the first pixel PX1 (e.g., the first pixel PX1 as illustrated in FIG. 5) and less than the difference ΔW between the second width W2 and the first width W1 in the second pixel PX2 (e.g., the second pixel PX2 as illustrated in FIG. 5). FIG. 9 illustrates that the second width W2 of the second opening OP2 is the same as a width of the pixel electrode 211. However, the disclosure is not limited thereto. According to another embodiment, the second width W2 of the second opening OP2 may be less than the width of the pixel electrode 211.

Light emitted from the organic light-emitting diode 200 may include light L1 obliquely incident toward a side surface of the light modulating layer 350 and light L3 penetrating through the bonding layer 410 and extracted approximately in the third direction (or z direction) without a change of a direction.

From the light L1 and the light L3, the light L1 incident onto an inclined side surface of the light modulating layer 350 may be totally internally reflected by the interface between the bonding layer 410 and the light modulating layer 350 and may have a changed path (e.g., a path in the thickness direction, third direction, or z direction indicated by totally internally reflected light L2), and totally internally reflected light L2 may be extracted approximately in the third direction (or z direction). Thus, an area of an emission pattern of a pixel, the area being generated in a virtual front side, may be increased. That is, light extraction efficiency of the front side may be improved due to the total internal reflection at the interface between the light modulating layer 350 having the first refractive index and the bonding layer 410 having the second refractive index that is greater than the first refractive index. Thus, the visibility of the front side may be improved. That is, according to one or more embodiments of the disclosure, because the bonding layer 410 for bonding the functional layer 420 has the second refractive index, an additional high refractive index layer for filling the second opening OP2 of the light modulating layer 350 may not be used, and a coating process, a curing process, etc. to form the high refractive index layer may be omitted. Thus, a structure and a manufacturing process of the display apparatus 1 (e.g., display apparatus illustrated in FIG. 1) may be simplified.

In order that the light L1 incident into the light modulating layer 350 is totally internally reflected by the interface between the bonding layer 410 and the light modulating layer 350, an incident angle of the light L1 incident into the light modulating layer 350 has to be greater than a critical angle. To this end, a side surface of the light modulating layer 350 may have an inclination degree θ of about 70°. The light modulating layer 350 may be formed by patterning a material to form the light modulating layer 350 above the encapsulating member 300 by using a photolithography process. In order that an inner wall of the second opening OP2 is formed to have the inclination degree θ of about 70° after the photo lithography process, the light modulating layer 350 may have a thickness H1 of about 1.5 μm to about 2.5 μm.

In one or more embodiments, the bonding layer 410 may be located between the functional layer 420 and the light modulating layer 350 in a state in which the bonding layer 410 is first formed as a film at the lower surface of the functional layer 420, and then, the functional layer 420 and the light modulating layer 350 may be bonded to each other by using a lamination process. In this process, in order that the side surface of the light modulating layer 350 generally adheres to the bonding layer 410, the lower end C of the inner wall of the second opening OP2 may be rounded to have a concave shape as illustrated in FIG. 10. When a point at which the side surface of the light modulating layer 350 meets an upper surface of the second inorganic layer 330 has a shape that is bent at a predetermined or set angle, an empty space may be formed between the light modulating layer 350 and the bonding layer 410 at the lower end C of the inner wall of the second opening OP2. This empty space may be filled with air having a refractive index of 1, and thus, the improvement of light extraction efficiency due to total internal reflection as described above may deteriorate or be reduced.

Referring to FIG. 9, the bonding layer 410 may further include scattered particles 416 distributed in the bonding film 412.

When the organic light-emitting diode 200 emits white light, a white property observed at the front side and a white property observed at the side surface may be different from each other. In other words, the color white observed from the front side may appear to have a tint (e.g., a different color tint) and/or brightness at a side surface. A white angular dependency (WAD) may be used to evaluate a change in the white property based on an observation angle. A level of the change may be evaluated by measuring the amount of change of brightness and the amount of change of color coordinates according to an observation angle of the front side which is perpendicular to a screen. Light L4 from the light that is emitted from the organic light-emitting diode 200 may be refracted and/or scattered by the scattered particles 416 distributed in the bonding film 412, and thus, a viewing angle of the display apparatus 1 (e.g., display apparatus illustrated in FIG. 1) may be increased and the difference between the white property observed at the front side and the white property observed at the side surface may be reduced.

The scattered particles 416 may have a greater particle size than the high refractive particles 414. For example, an average particle diameter of the scattered particles 416 may be about 50 nm to about 1000 nm.

The scattered particles 416 may include inorganic particles and/or organic particles. The inorganic particles may include silica, $ZrO_2$, $TiO_2$, $Al_2O_3$, $In_2O_3$, ZnO, $SnO_2$, $Sb_2O_3$, etc., and the organic particles may include polystyrene, PMMA, acryl-styrene co-polymer, melamine, PC, etc.

Figure 11:
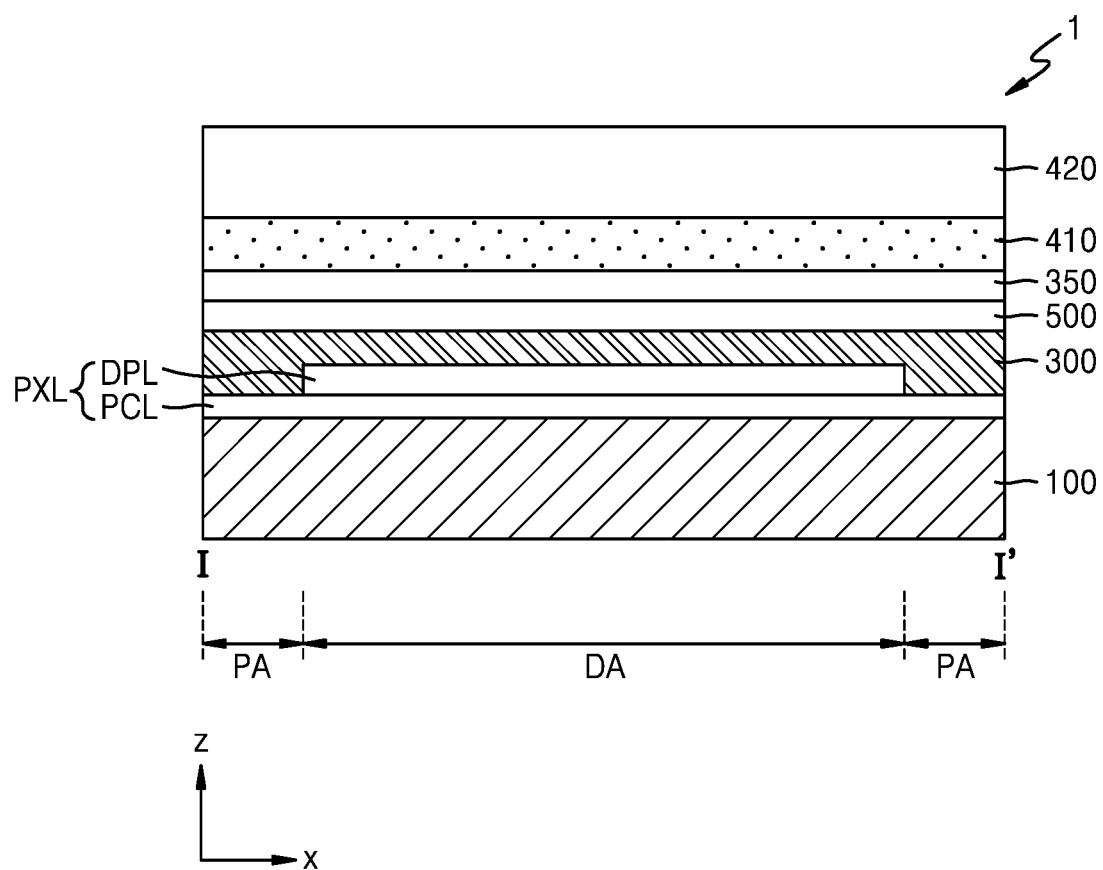
FIG. 11 is another example of a schematic cross-sectional view taken along the line I-I' of FIG. 1.
Figure 12:
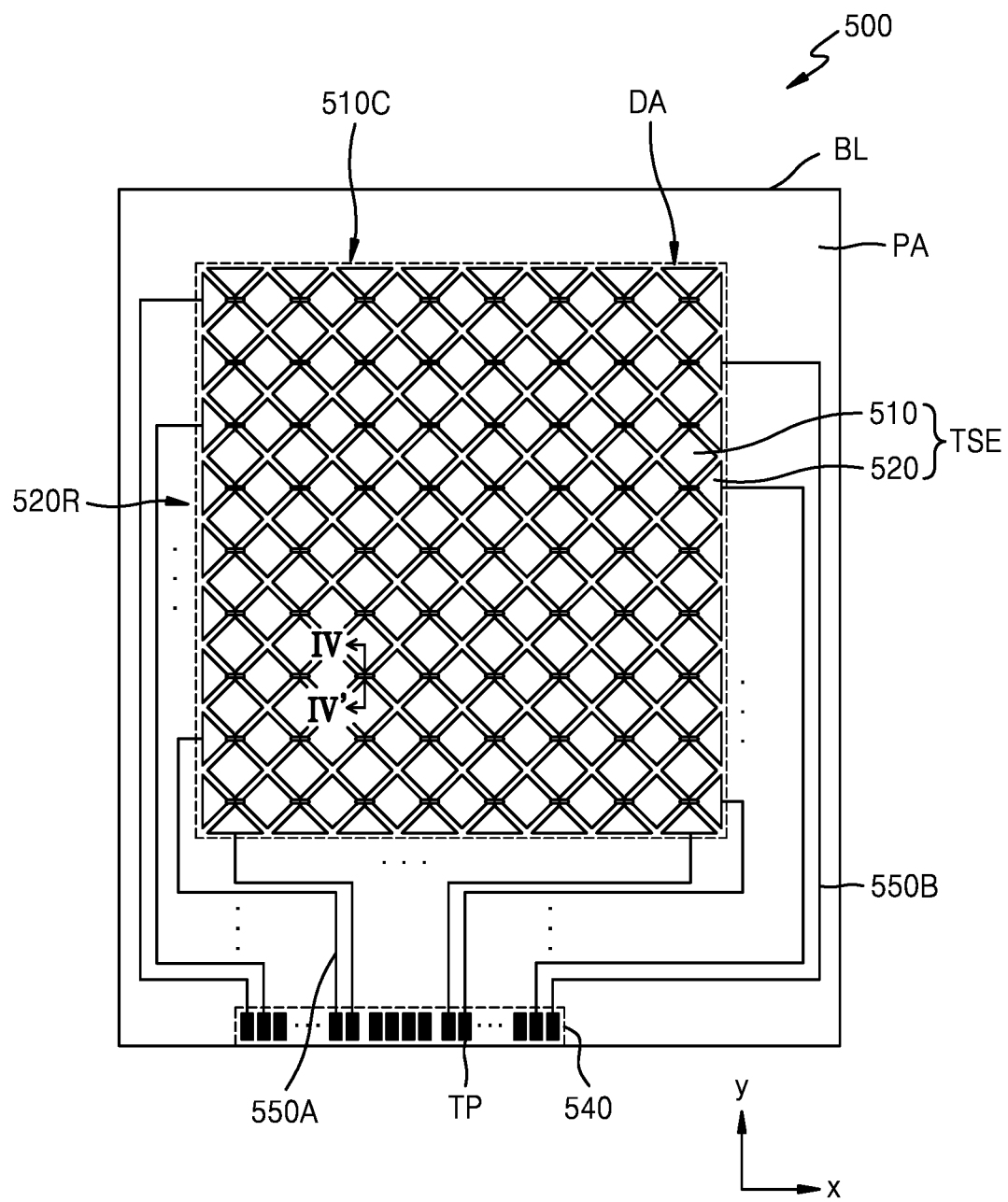
FIG. 12 is a schematic plan view of an example of an input sensing layer of FIG. 11.
Figure 13:
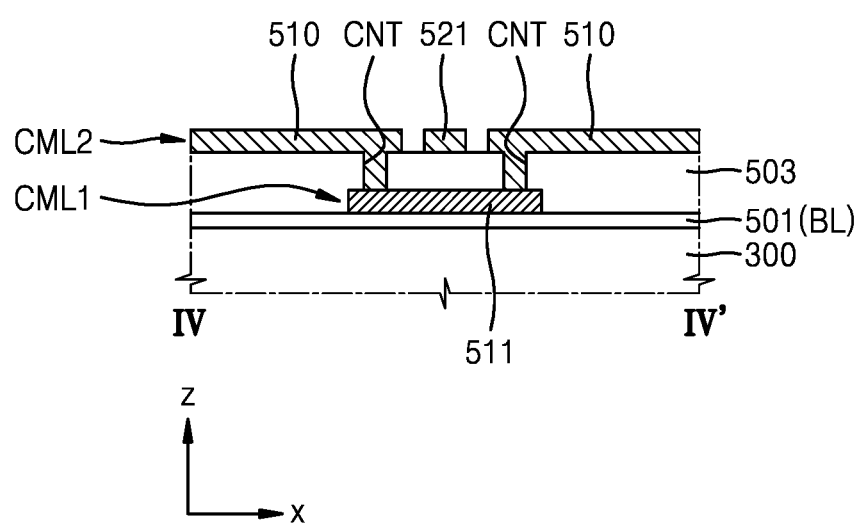
FIG. 13 is an example of a schematic cross-sectional view taken along the line IV-IV' of FIG. 12.
Figure 14A:
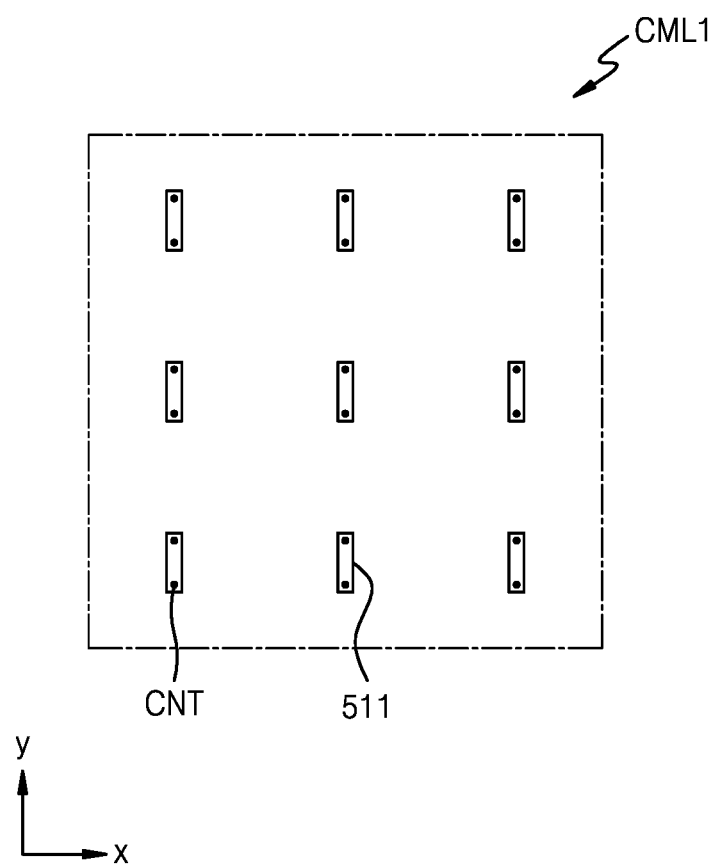
FIG. 14A is a plan view of a first conductive layer of FIG. 13
Figure 14B:
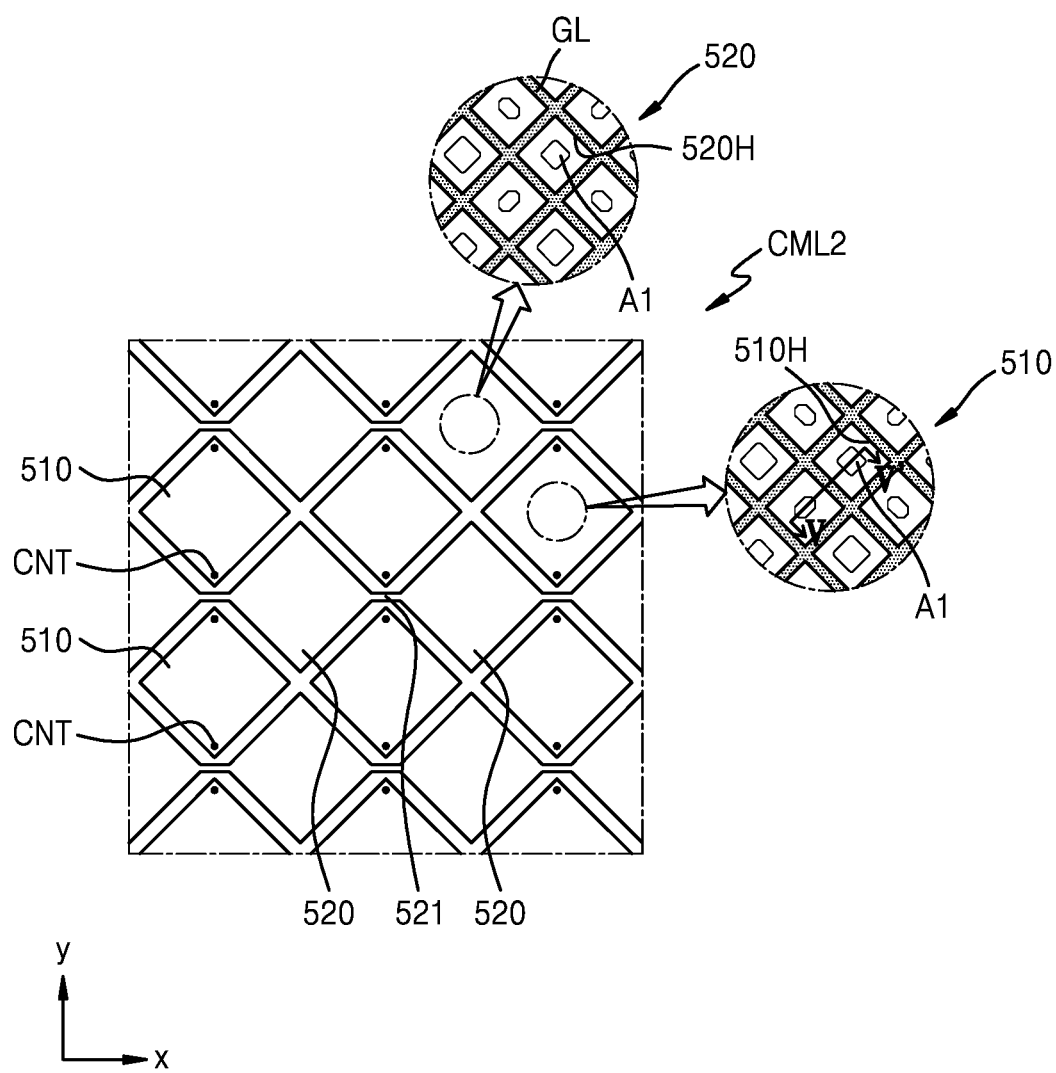
FIG. 14B is a plan view of a second conductive layer of FIG. 13.
Figure 15:
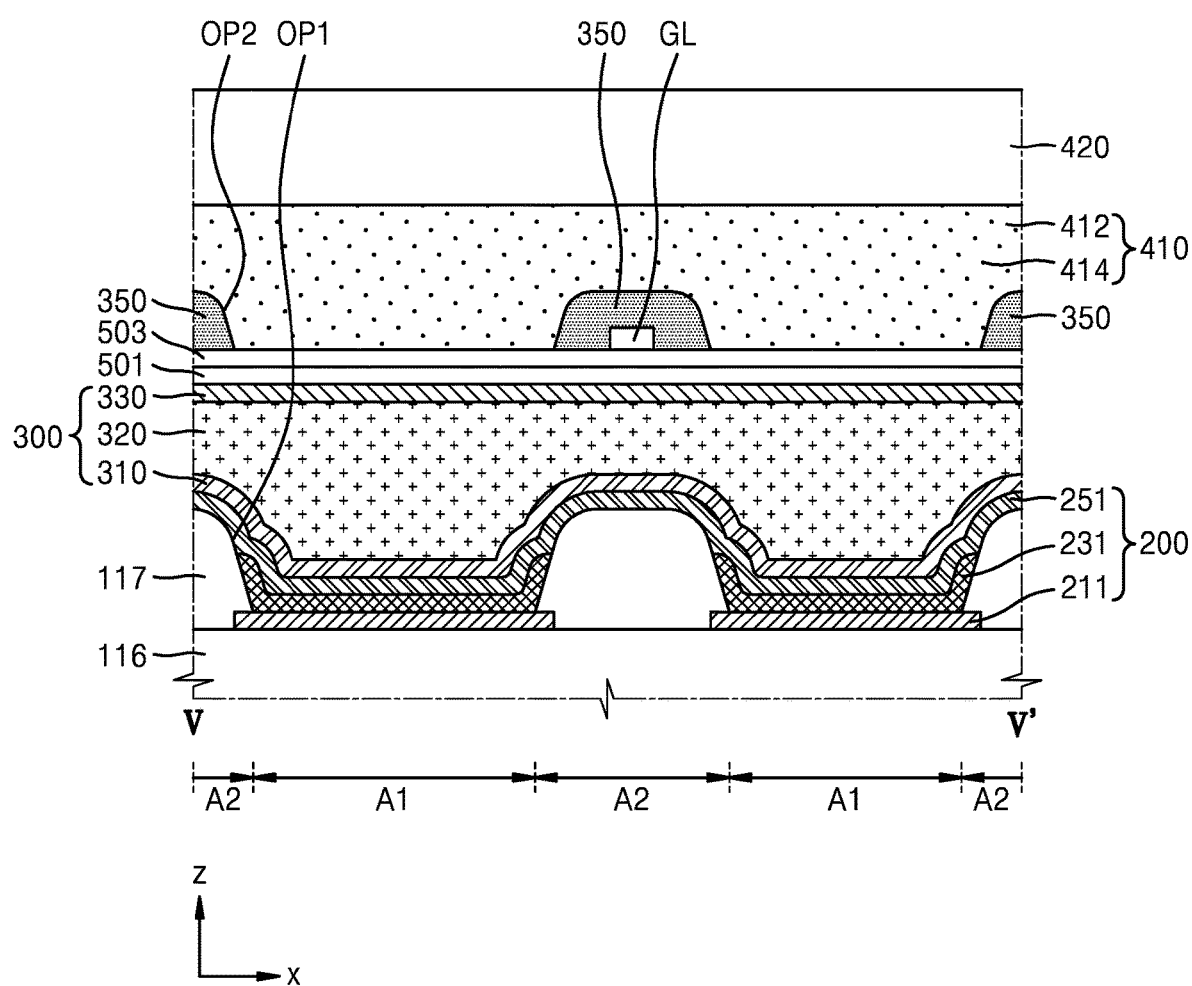
FIG. 15 is an example of a schematic cross-sectional view taken along the line V-V' of FIG. 14B.

FIG. 11 is a schematic cross-sectional view of another example of a portion taken along the line I-I' of FIG. 1. FIG. 12 is a schematic plan view of an example of an input sensing layer 500 of FIG. 11. FIG. 13 is a schematic cross-sectional view of an example of a portion taken along the line IV-IV' of FIG. 12. FIG. 14A is a plan view of a first conductive layer CML1 of FIG. 13 and FIG. 14B is a plan view of a second conductive layer CML2 of FIG. 13. FIG. 15 is a schematic cross-sectional view of an example of a portion taken along the line V-V' of FIG. 14B. Hereinafter, descriptions of components that are the same as the components described above are not repeated.

Referring to FIG. 11, the display apparatus 1 may include the substrate 100, the pixel layer PXL above the substrate 100, the encapsulating member 300 encapsulating the pixel layer PXL, the input sensing layer 500 on the encapsulating member 300, the light modulating layer 350 on the input sensing layer 500, the bonding layer 410 on the light modulating layer 350, and the functional layer 420 on the bonding layer 410, which are sequentially stacked in a thickness direction (or z direction). That is, compared to FIG. 1, FIG. 11 further includes the input sensing layer 500.

Referring to FIG. 12, the input sensing layer 500 may include a base layer BL including the display area DA and the peripheral area PA. The base layer BL may correspond to a shape of the substrate 100 and may be provided in substantially the same shape as the substrate 100. According to one or more embodiments, the base layer BL may be the second inorganic layer 330 (e.g., the second inorganic layer 330 as illustrated in FIG. 15) arranged on a portion of the encapsulating member (e.g., an uppermost layer of the encapsulating member 300). However, the disclosure is not limited thereto. According to another embodiment, the base layer BL may be separate from the encapsulating member 300 and include an insulating substrate or an insulating film including an insulating material, such as glass, polymer resins, etc.

A plurality of sensing electrodes TSE may be arranged in the display area DA. Sensing signal lines connected to the sensing electrodes TSE may be arranged in the peripheral area PA. The sensing electrodes TSE may include a first sensing electrode 510 and a second sensing electrode 520. The sensing signal lines may include a first sensing signal line 550A and a second sensing signal line 550B. That is, the input sensing layer 500 may include the first sensing electrodes 510, the first sensing signal lines 550A connected to the first sensing electrodes 510, the second sensing electrodes 520, and the second sensing signal lines 550B connected to the second sensing electrodes 520. The input sensing layer 500 may sense an external input by using a mutual cap method and/or a self-cap method.

The input sensing layer 500 may include a plurality of conductive layers. Referring to FIG. 13, the input sensing layer 500 may include the first conductive layer CML1 and the second conductive layer CML2. A first insulating layer 501 may be arranged between the first conductive layer CML1 and the encapsulating member 300 as the base layer BL, and a second insulating layer 503 (e.g., a portion of the second insulating layer 503) may be arranged between the first conductive layer CML1 and the second conductive layer CML2.

According to one or more embodiments, the first and second insulating layers 501 and 503 may include an inorganic insulating layer including, for example, silicon nitride. According to another embodiment, the first insulating layer 501 may be omitted and the first conductive layer CML1 may be located directly above the encapsulating member 300. According to another embodiment, the first and second insulating layers 501 and 503 may include organic insulating layers.

The first conductive layer CML1 may include bridge electrodes 511 as illustrated in FIG. 14A. The second conductive layer CML2 may include the first sensing electrodes 510, the second sensing electrodes 520, and connection electrodes 521 as illustrated in FIG. 14B. The first and second conductive layers CML1 and CML2 may include metal. For example, the first and second conductive layers CML1 and CML2 may include Mo, Al, Cu, Ti, etc., and may be formed as multiple layers or a single layer including the materials described above. According to one or more embodiments, the first and second conductive layers CML1 and CML2 may include multiple layers of Ti/Al/Ti.

The first sensing electrodes 510 may be connected to each other via bridge electrodes 511 formed on a different level from the first sensing electrodes 510. In one or more embodiments, the bridge electrodes 511 are formed on a level below the level of the first sensing electrodes 510. The bridge electrodes 511 connecting (e.g., electrically connecting) the first sensing electrodes 510 that are adjacent to each other may contact the adjacent first sensing electrodes 510 through a contact hole CNT formed in or through the second insulating layer 503. The second sensing electrodes 520 may be connected to each other via the connecting electrodes 521 formed on the same layer as the second sensing electrodes 520 as illustrated in FIG. 14B.

FIGS. 13, 14A, and 14B illustrate an example in which the bridge electrodes 511 are located below the first sensing electrodes 510 and the second sensing electrodes 520. However, the disclosure is not limited thereto. The first conductive layer CML1 may include the first sensing electrodes 510 and the second sensing electrodes 520, and the second conductive layer CML2 may include the bridge electrodes 511.

The first sensing electrodes 510 may be arranged in a second direction (or a y direction) and the second sensing electrodes 520 may be arranged in a first direction (or an x direction) crossing the second direction (or the y direction). The first sensing electrodes 510 may be connected to each other via the bridge electrodes 511 between the first sensing electrodes 510 that are adjacent to each other and may form a first sensing line 510C. The second sensing electrodes 520 arranged in the first direction (or the x direction) may be connected to each other via the connecting electrode 521 between the second sensing electrodes that are adjacent to each other and may form a second sensing line 520R. The first sensing lines 510C and the second sensing lines 520R may cross each other. For example, the first sensing lines 510C and the second sensing lines 520R may be perpendicular or normal to each other.

The first sensing lines 510C and the second sensing lines 520R may be arranged in the display area DA and may be connected to a sensing signal pad TP of a pad portion 540 through the first sensing signal lines 550A and the second sensing signal lines 550B formed in the peripheral area PA. The first sensing lines 510C may be connected to the first sensing signal lines 550A, respectively, and the second sensing lines 520R may be connected to the second sensing signal lines 550B, respectively.

Referring to FIG. 14B, the first sensing electrodes 510 and the second sensing electrodes 520 may have (e.g., each have) an approximately diamond shape. The first sensing electrodes 510 may include grid lines GL forming a grid structure including a plurality of holes 510H. The holes 510H may be arranged to overlap (e.g., overlap in the thickness direction or z direction) the first area A1 of a pixel. Similarly, the second sensing electrodes 520 may include grid lines GL forming a grid structure including a plurality of holes 520H. The holes 520H may be arranged to overlap (e.g., overlap in the thickness direction or z direction) the first area A1 of a pixel. Each of the holes 510H and 520H may have a different area. A line width of each of the grid lines GL may be several micrometers.

FIG. 15 illustrates the first insulating layer 501 and the second insulating layer 503 above the encapsulating member 300, and the grid line GL on the second insulating layer 503.

The grid line GL may be arranged to correspond to the second area A2 of a pixel as illustrated in FIG. 15.

The light modulating layer 350 may be arranged above the second insulating layer 503. The light modulating layer 350 may be arranged to correspond to the second area A2 of the pixel and may include the second opening OP2 exposing an area corresponding to the first area A1 of the pixel. The light modulating layer 350 may be located to overlap the grid line GL. For example, the grid line GL may be located above the second insulating layer 503 and the light modulating layer 350 may cover the grid line GL.

The bonding layer 410 for bonding the light modulating layer 350 with the functional layer 420, such as a polarization layer, etc., may be located in the second opening OP2 of the light modulating layer 350. The bonding layer 410 may have a second refractive index that is greater than a first refractive index of the light modulating layer 350. Accordingly, light progressing in a side direction of the light modulating layer 350, from the light that is emitted from the emission layer of the organic light-emitting diode 200, may be totally internally reflected by an interface between the light modulating layer 350 and the bonding layer 410 and may have a progression path that is changed to a forward direction of the display apparatus 1 (e.g., display apparatus illustrated in FIG. 1). Thus, light extraction efficiency of the display apparatus 1 (e.g., display apparatus illustrated in FIG. 1) may be improved. The bonding layer 410 may include the bonding film 412 and the high refractive particles 414 distributed in the bonding film 412. Here, the high refractive particles 414 may be included in the bonding layer 410 by about 30 wt % to about 60 wt %, as described above. In one or more embodiments, the bonding layer 410 may further include the scattered particles 416 to reduce a color deviation between the light emitted to a front side and the light emitted to a lateral side (e.g., a left or right side surface) of the display apparatus.

According to one or more embodiments, light extraction efficiency of the display apparatus may be improved and a manufacturing process of the display apparatus may be simplified.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display apparatus comprising:
a substrate;
a pixel layer comprising a plurality of display devices on the substrate;
an encapsulating member encapsulating the pixel layer and comprising an uppermost inorganic layer;
a light modulating layer on the encapsulating member;
a functional layer on the light modulating layer;
a bonding layer between the light modulating layer and the functional layer to bond the light modulating layer and the functional layer; and
an insulating layer between the substrate and the encapsulation member,
wherein the insulating layer has first openings corresponding to the plurality of display devices and a lower surface of a first opening from among the first openings defines a first width,
wherein the light modulating layer has second openings corresponding to the plurality of display devices, each of the second openings comprising an inner wall that defines the second opening, each of the inner walls having a lower end that directly meets an upper surface of the uppermost inorganic layer of the encapsulating member and a distance between the lower end of the second opening on two opposite sides of the second opening defines a second width where the lower end directly meets the upper surface of the uppermost inorganic layer of the encapsulating member,
wherein the second width is greater than the first width,
wherein the bonding layer is in the second openings and has a refractive index that is greater than a refractive index of the light modulating layer, and
wherein at least one lower end of the lower ends of the second openings is rounded to have a concave shape at a point where the at least one lower end directly meets the upper surface of the uppermost inorganic layer of the encapsulating member.

2. The display apparatus of claim 1, wherein the bonding layer comprises a bonding film and a plurality of high refractive index particles is distributed in the bonding film, and
wherein the refractive index of the bonding layer is equal to or greater than about 1.6.

3. The display apparatus of claim 2, wherein the bonding layer comprises about 30 wt % to about 60 wt % of the plurality of high refractive index particles, and
wherein the refractive index of the bonding layer is about 1.6 to about 1.8.

4. The display apparatus of claim 2, wherein a plurality of light scattering particles is distributed in the bonding film.

5. The display apparatus of claim 1, wherein at least one inner wall of the inner walls of the second openings further comprises an inclined surface, and
wherein a thickness of the light modulating layer is about 1.5 μm to about 2.5 μm.

6. The display apparatus of claim 1, wherein each of the plurality of display devices comprises a pixel electrode, an intermediate layer comprising an emission layer on the pixel electrode, and an opposite electrode on the intermediate layer, and wherein a portion of light emitted from the emission layer is to be totally internally reflected by an interface between the bonding layer and at least one of the inner walls of the second openings.

7. The display apparatus of claim 1, wherein the functional layer comprises a polarization layer.

8. The display apparatus of claim 1, wherein the upper surface of the uppermost inorganic layer of the encapsulating member is substantially planar.

9. A display apparatus comprising:
a display device to emit light;
an insulating layer having a first opening corresponding to the display device;
an encapsulating member encapsulating the display device and comprising an uppermost inorganic layer;
a light modulating layer on the display device and having second opening corresponding to the display device, the light modulating layer comprising an inner wall that defines the second opening, the inner wall having a lower end that directly meets an upper surface of the uppermost inorganic layer of the encapsulating member;
a bonding layer filling the second opening and on the light modulating layer; and
a functional layer on the bonding layer and bonded to the light modulating layer via the bonding layer,
wherein a lower surface the first opening defines a first width and a distance between the lower end on two opposite sides of the second opening defines a second width where the lower end directly meets the upper surface of the uppermost inorganic layer of the encapsulating member,
wherein the second width is greater than the first width,
wherein the light modulating layer has a first refractive index, and the bonding layer has a second refractive index that is greater than the first refractive index,
wherein a portion of the light emitted from the display device is to be totally internally reflected by an interface between the inner wall of the second opening and the bonding layer, and
wherein the lower end is rounded to have a concave shape at a point where the lower end directly meets the upper surface of the uppermost inorganic layer of the encapsulating member.

10. The display apparatus of claim 9, wherein the display device comprises a pixel electrode, an intermediate layer comprising an emission layer on the pixel electrode, and an opposite electrode on the intermediate layer, and wherein the insulating layer is covering an edge of the pixel electrode.

11. The display apparatus of claim 9, wherein the encapsulating member is between the display device and the light modulating layer.

12. The display apparatus of claim 9, wherein the bonding layer comprises a bonding film and a plurality of high refractive index particles distributed in the bonding film.

13. The display apparatus of claim 12, wherein the bonding layer comprises about 30 wt % to about 60 wt % of the plurality of high refractive index particles.

14. The display apparatus of claim 12, wherein the second refractive index of the bonding layer is about 1.6 to about 1.8.

15. The display apparatus of claim 12, wherein the bonding layer further comprises scattered particles distributed in the bonding film.

16. The display apparatus of claim 9, wherein the inner wall of the second opening comprises an inclined surface, and wherein a thickness of the light modulating layer is about 1.5 μm to about 2.5 μm.

\* \* \* \* \*